US012588345B1

(12) United States Patent
Mezouari et al.

(10) Patent No.: US 12,588,345 B1
(45) Date of Patent: Mar. 24, 2026

(54) MQW SIZE REDUCTION FOR IMPROVED EXTERNAL QUANTUM EFFICIENCY

(71) Applicant: Meta Platforms Technologies, LLC, Menlo Park, CA (US)

(72) Inventors: Samir Mezouari, Swindon (GB); Robert Leslie Breakspear, Swindon (GB); Andrea Pinos, Plymouth (GB); Wei Sin Tan, Plymouth (GB)

(73) Assignee: Meta Platforms Technologies, LLC, Menlo Park, CA (US)

( * ) Notice: Subject to any disclaimer, the term of this patent is extended or adjusted under 35 U.S.C. 154(b) by 708 days.

(21) Appl. No.: 17/890,715

(22) Filed: Aug. 18, 2022

(51) Int. Cl.
| | |
|---|---|
| *H10H 29/14* | (2025.01) |
| *H10H 20/01* | (2025.01) |
| *H10H 20/841* | (2025.01) |
| *H10H 20/855* | (2025.01) |

(52) U.S. Cl.
CPC ........ *H10H 29/142* (2025.01); *H10H 20/018* (2025.01); *H10H 20/841* (2025.01); *H10H 20/855* (2025.01); *H10H 20/0363* (2025.01)

(58) Field of Classification Search
None
See application file for complete search history.

(56) References Cited

U.S. PATENT DOCUMENTS

| | | | |
|---|---|---|---|
| 8,043,942 B2 | 10/2011 | Lee et al. | |
| 8,847,249 B2 | 9/2014 | Raring et al. | |
| 11,101,405 B2 | 8/2021 | Mcgroddy et al. | |
| 2001/0042866 A1* | 11/2001 | Coman | ................. H10H 20/825 |
| | | | 438/22 |
| 2005/0018962 A1* | 1/2005 | Cho | ...................... C03B 11/082 |
| | | | 385/33 |

(Continued)

FOREIGN PATENT DOCUMENTS

| | | |
|---|---|---|
| JP | 2004221480 A | 8/2004 |
| WO | WO-2018135690 A1 | 7/2018 |
| WO | WO-2021050731 A1 | 3/2021 |

OTHER PUBLICATIONS

Cai Y., et al., "Direct Epitaxial Approach to Achieve a Monolithic On-Chip Integration of a HEMT and a single Micro-LED with a High-Modulation Bandwidth," ACS Applied Electronic Materials, 2021, vol. 3, pp. 445-450.

(Continued)

*Primary Examiner* — Bilkis Jahan
(74) *Attorney, Agent, or Firm* — Greenberg Traurig, LLP

(57) ABSTRACT

A light source a backplane including drive circuits formed thereon, an array of micro-light emitting diodes (micro-LEDs) bonded to the backplane, and an array of micro-lenses on the array of micro-LEDs. Each micro-LED of the array of micro-LEDs includes a mesa structure that includes a p-doped semiconductor layer, an n-doped semiconductor layer, an active region between the p-doped semiconductor layer and the n-doped semiconductor layer, and a dielectric layer underneath the p-doped semiconductor layer or the n-doped semiconductor layer and surrounding the active region. In some embodiments, the center of the active region of a micro-LED of the array of micro-LEDs is horizontally offset from the center of the mesa structure of the micro-LED and the center of a corresponding micro-lens of the array of micro-lenses.

12 Claims, 23 Drawing Sheets

(56)                        References Cited

U.S. PATENT DOCUMENTS

| | | | | |
|---|---|---|---|---|
| 2015/0249196 A1* | 9/2015 | Williams | ............ | H10H 20/835 |
| | | | | 257/88 |
| 2016/0202476 A1* | 7/2016 | Chong | ................ | G02B 3/0043 |
| | | | | 359/743 |
| 2017/0069611 A1* | 3/2017 | Zhang | ................ | H01L 25/0753 |
| 2022/0352118 A1* | 11/2022 | Harumoto | ........... | H10H 20/857 |
| 2022/0352423 A1* | 11/2022 | Chen | .................... | H01L 25/167 |

OTHER PUBLICATIONS

Chen H., et al., "Optical Cavity Effects in InGaN Micro-Light-Emitting Diodes with Metallic Coating," IEEE Photonics Journal, 2017, 9 pages.
Ironside D. J., et al., "Review of Lateral Epitaxial Overgrowth of Buried Dielectric Structures for Electronics and Photonics," Progress in Quantum Electronics, 2021, vol. 77, pp. 1-20.

* cited by examiner

700

705

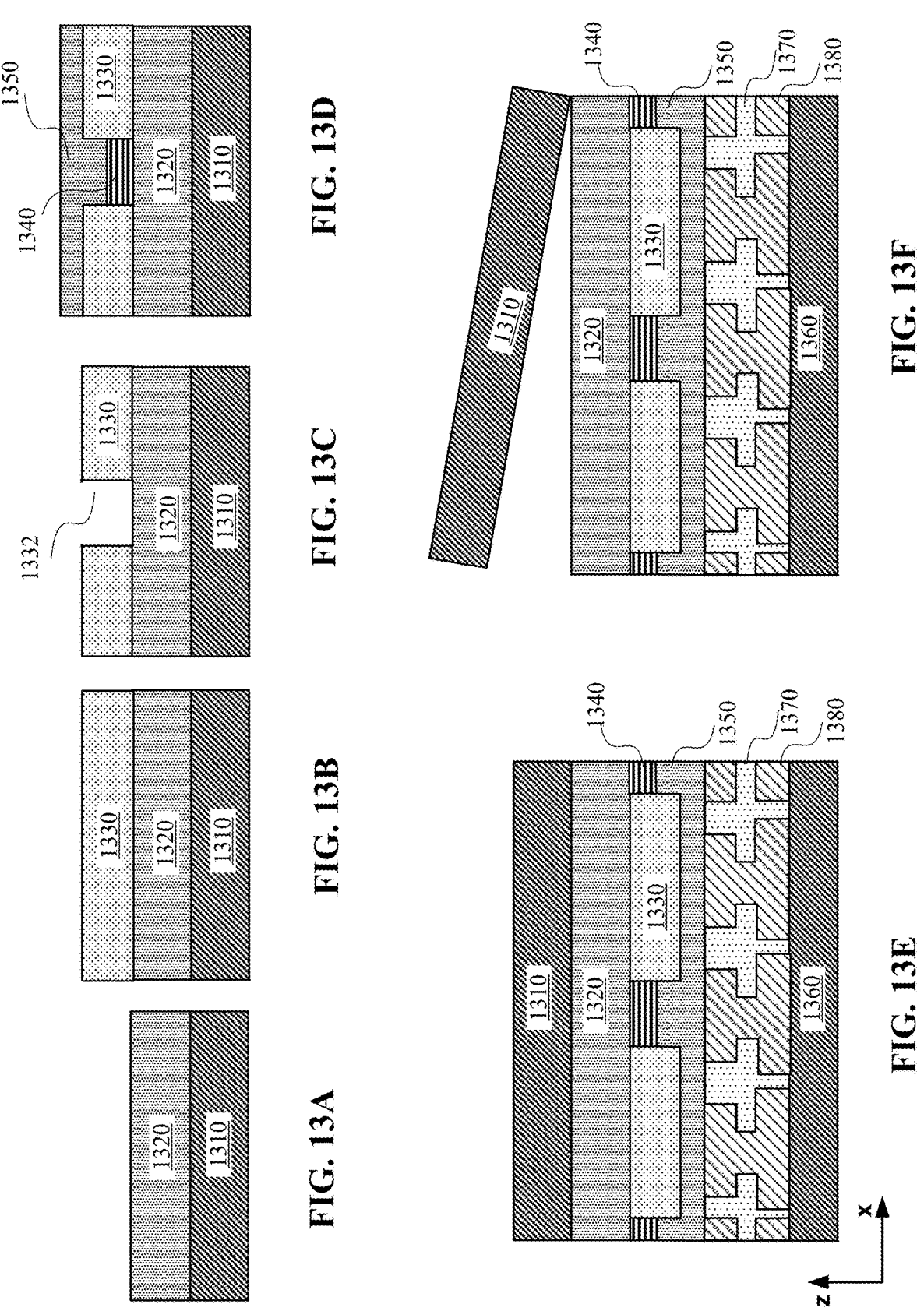

2100

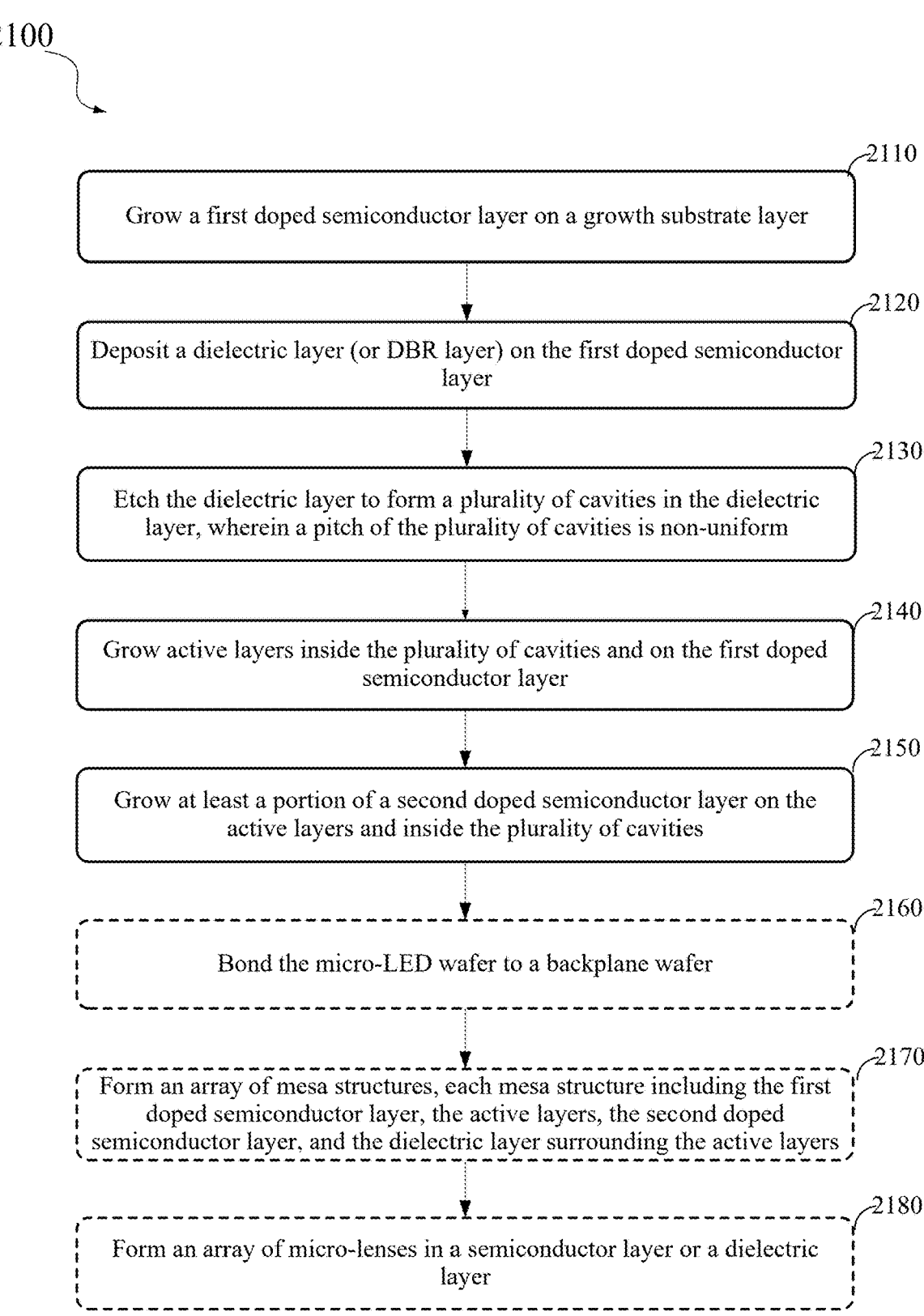

2110

Grow a first doped semiconductor layer on a growth substrate layer

2120

Deposit a dielectric layer (or DBR layer) on the first doped semiconductor layer

2130

Etch the dielectric layer to form a plurality of cavities in the dielectric layer, wherein a pitch of the plurality of cavities is non-uniform

2140

Grow active layers inside the plurality of cavities and on the first doped semiconductor layer

2150

Grow at least a portion of a second doped semiconductor layer on the active layers and inside the plurality of cavities

2160

Bond the micro-LED wafer to a backplane wafer

2170

Form an array of mesa structures, each mesa structure including the first doped semiconductor layer, the active layers, the second doped semiconductor layer, and the dielectric layer surrounding the active layers

2180

Form an array of micro-lenses in a semiconductor layer or a dielectric layer

FIG. 21

MQW SIZE REDUCTION FOR IMPROVED EXTERNAL QUANTUM EFFICIENCY

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("μLEDs") based on III-V semiconductors, such as alloys of AlN, GaN, InN, AlGaInP, other ternary and quaternary nitride, phosphide, and arsenide compositions, have begun to be developed for various display applications due to their small size (e.g., with a linear dimension less than 100 μm, less than 50 μm, less than 10 μm, or less than 5 μm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro-light emitting diode (micro-LED) devices. More specifically, and without limitation, disclosed herein are techniques for improving the efficiencies of micro-LEDs. Various inventive embodiments are described herein, including devices, systems, methods, structures, materials, processes, and the like.

According to certain embodiments, a light source may include a backplane including drive circuits formed thereon, an array of micro-light emitting diodes (micro-LEDs) bonded to the backplane, and an array of micro-lenses on the array of micro-LEDs. Each micro-LED of the array of micro-LEDs includes a mesa structure that includes a p-doped semiconductor layer, an n-doped semiconductor layer, an active region between the p-doped semiconductor layer and the n-doped semiconductor layer, and a dielectric layer underneath the p-doped semiconductor layer or the n-doped semiconductor layer and surrounding the active region. Each micro-lens of the array of micro-lenses may collimate light emitted by a respective micro-LED of the array of micro-LEDs. In some embodiments, the center of the active region of a micro-LED of the array of micro-LEDs may be horizontally offset from a center of the mesa structure of the micro-LED and a center of a corresponding micro-lens of the array of micro-lenses.

In some embodiments, the width of the active region may be less than about 90%, 75% or 50% of the width of the p-doped semiconductor layer or the n-doped semiconductor layer. In some embodiments, the width of the active region of a first micro-LED of the array of micro-LEDs may be different from the width of the active region of a second micro-LED of the array of micro-LEDs. In some embodiments, the shape of the active region of a first micro-LED of the array of micro-LEDs may be different from the shape of the active region of a second micro-LED of the array of micro-LEDs. In some embodiments, the horizontal offset between the center of the active region and the center of the mesa structure of a first micro-LED of the array of micro-LEDs may be different from the horizontal offset between the center of the active region and the center of the mesa structure of a second micro-LED of the array of micro-LEDs.

In some embodiments, the dielectric layer may include a plurality of distributed Bragg reflector layers formed on surfaces of the p-doped semiconductor layer or the n-doped semiconductor layer. In some embodiments, each micro-LED of the array of micro-LEDs may further include a plurality of distributed Bragg reflector layers surrounding the dielectric layer and the p-doped or n-dope semiconductor layer, where the plurality of distributed Bragg reflector layers may include semiconductor layers. In some embodiments, the p-doped semiconductor layer or the n-doped semiconductor layer may be surrounded by the dielectric layer and is grown in the dielectric layer. In some embodiments, the array of micro-lenses may include stepped micro-lenses. In some embodiments, the array of micro-lenses may include a semiconductor material or a dielectric material. In some embodiments, the width of the active region may be less than about 305 or about 25% of the pitch of the array of micro-LEDs. In some embodiments, the light source may also include a transparent conductive layer between the array of micro-LEDs and the array of micro-lenses.

According to certain embodiments, a method of fabricating a micro-light emitting diode (micro-LED) device may include growing a first doped semiconductor layer on a growth substrate layer, depositing a dielectric layer on the first doped semiconductor layer, etching the dielectric layer to form a plurality of cavities that has a non-uniform pitch in the dielectric layer, growing active layers inside the plurality of cavities and on the first doped semiconductor layer, and growing at least a portion of a second doped semiconductor layer on the active layers and inside the plurality of cavities. In some embodiments, the plurality of cavities may be characterized by at least one of: a width of a cavity of the plurality of cavities being less than a quarter of a pitch of the plurality of cavities, cavities of the plurality of cavities having different sizes, or the cavities of the plurality of cavities having different shapes.

In some embodiments, growing the first doped semiconductor layer may include depositing an overgrowth mask layer on the growth substrate layer, patterning the overgrowth mask layer to form an array of apertures in the overgrowth mask layer, and growing the first doped semiconductor layer on the growth substrate layer through the array of apertures, the first doped semiconductor layer including an array of semiconductor structures grown through the overgrowth mask layer. Depositing the dielectric layer on the first doped semiconductor layer may include depositing a plurality of distributed Bragg reflector (DBR) layers on surfaces of the array of semiconductor structures, and etching the dielectric layer to form the plurality of cavities in the dielectric layer may include etching the plurality of DBR layers on top of the array of semiconductor structures.

In some embodiments, the method fabricating the micro-LED device may also include forming a bonding layer on the second doped semiconductor layer, bonding the bonding layer to a backplane wafer, depositing a transparent conductive layer on the growth substrate layer, depositing a lens material layer on the transparent conductive layer, and forming an array of micro-lenses in the lens material layer.

In some embodiments, the method fabricating the micro-LED device may also include forming a bonding layer on the second doped semiconductor layer, bonding the bonding layer to a backplane wafer, removing the growth substrate layer to expose the first doped semiconductor layer, forming an array of micro-lenses in the first doped semiconductor layer or another semiconductor layer, etching through regions of at least the first doped semiconductor layer and the dielectric layer to form an array of mesa structures, and depositing filling materials that include a metal in regions between mesa structures of the array of mesa structures.

In some embodiments, the method fabricating the micro-LED device may also include forming a bonding layer on the second doped semiconductor layer, bonding the bonding layer to a backplane wafer, removing the growth substrate layer to expose the first doped semiconductor layer, etching through regions of at least the first doped semiconductor layer and the dielectric layer to form an array of mesa structures, depositing filling materials that include a metal in regions between mesa structures of the array of mesa structures, depositing a lens material layer on the array of mesa structures, and forming an array of micro-lenses in the lens material layer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIGS. 13A-13I illustrate an example of a process of fabricating a micro-LED device according to certain embodiments.

FIG. 21 includes a flowchart illustrating an example of a process of fabricating a micro-LED device according to certain embodiments.

Figure 1:
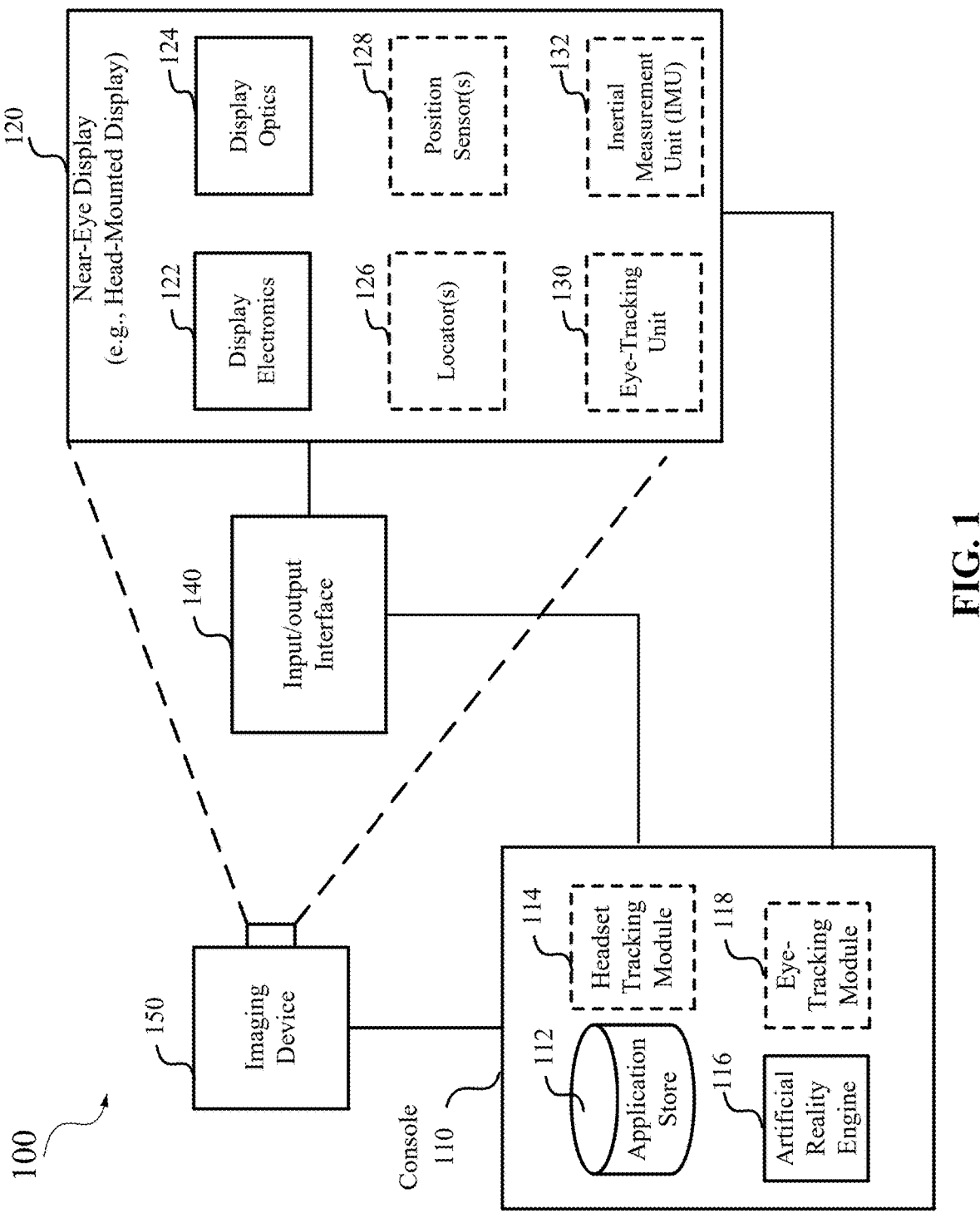
FIG. 1 is a simplified block diagram of an example of an artificial reality system environment including a near-eye display according to certain embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro-light emitting diode (micro-LED) devices. More specifically, and without limitation, disclosed herein are techniques for improving the efficiencies of micro-LEDs. Various inventive embodiments are described herein, including devices, systems, methods, structures, materials, processes, and the like.

Augmented reality (AR) and virtual reality (VR) applications may use near-eye displays that include tiny monochrome light emitters, such as mini- or micro-LEDs. In light emitting diodes (LEDs), photons may be generated through the recombination of electrons and holes within an active region (e.g., including one or more semiconductor layers that may form one or more quantum wells). The proportion of the carriers (e.g., electrons or holes) injected into the active region of an LED among the carriers that pass through the LED is referred to as the carrier injection efficiency. The ratio between the number of emitted photons and the number of carriers injected into the active region is referred to as the internal quantum efficiency (IQE) of the LED. Light emitted in the active region may be extracted from the LED at a certain light extraction efficiency (LEE). The ratio between the number of emitted photons extracted from the LED and the number of electrons passing through the LED is referred to as the external quantum efficiency (EQE) of the LED, which describes how efficiently the LED converts injected carriers into photons that are extracted from the LED. The EQE may be a product of the carrier injection efficiency, the IQE, and the LEE. In LEDs for ear-eye display, only light that is emitted from an LED into a certain direction and/or within a certain emission angle range (e.g., within about ±18.5°) may be collected by the display optics of the near-eye displays. The proportion of the emitted photons that are extracted from the LED and are collected by the display optics and delivered to the eyebox may be referred to herein as the collected LEE.

The internal quantum efficiency of an LED depends on the relative rates of competitive radiative (light producing) recombination and non-radiative (lossy) recombination that occur in the active region of the LED. Non-radiative recombination processes in the active region include Shockley-Read-Hall (SRH) recombination at defect sites, and electron-electron-hole (eeh) and/or electron-hole-hole (ehh) Auger recombination. The Auger recombination is a non-radiative process involving three carriers, which affects all sizes of LEDs. For micro-LEDs fabricated by epitaxial layer growth and micro-LED singulation through etching, the IQEs and EQEs of the micro-LEDs may be low due to, for example, high defect densities at the micro-LED mesa sidewalls caused by the abrupt ending of the lattice structure, chemical contamination, and/or structural damages (e.g., due to dry etch).

For example, in plasma etching, high-energy ions (e.g., $Ar^+$, $Cl_2^+$, $Cl^+$, or $HF^+$) may be used to bombard the exposed surfaces of semiconductor epitaxial layers. Due to the bombardment by high-energy particles, the surfaces created by the etching may be highly damaged, where the damages may include alterations to the crystal structure or other modifications to the surfaces. The damages may extend into the interior of the mesa structure, such as about 50 nm to about 500 nm below the surfaces formed by the etching. Therefore, the active region in proximity to the sidewalls of a mesa structure may have a high density of defects, such as lattice dislocations, dangling bonds, pores, grain boundaries, vacancies, surface oxides, surfaces modifications by plasma atoms, interstitial defects, substitutional defects, inclusion of precipitates, and the like. The defects may introduce energy states having deep or shallow energy levels in the bandgap. Carriers may be trapped by these energy states until they recombine non-radiatively. Therefore, the active region in proximity to the mesa sidewalls may have a higher rate of nonradiative recombination, which may reduce the efficiency of the micro-LED.

In micro-LEDs, the mesa structure may have very small sizes, for example, with a width less than about 10 μm, less than about 5 μm, less than about 3 μm, or less than about 2 μm. As such, the lateral size (e.g., diameter or width) of each micro-LED may be comparable to the minority carrier diffusion length. Therefore, a larger proportion of the total active region may be within the minority carrier diffusion length from the LED sidewall surfaces where the defect density and the defect-induced non-radiative recombination rate may be high. Therefore, a larger proportion of the injected carriers may diffuse to the regions near the sidewall surfaces, where the carriers may be subjected to a higher SRH recombination rate. This may cause the efficiency of the LED to decrease (in particular, at low current injection), cause the peak efficiency of the LED to decrease, and/or cause the peak efficiency operating current to increase. Increasing the injected current may cause the efficiencies of the micro-LEDs to drop due to the higher eeh or ehh Auger recombination rate at a higher current density, and may also cause spectral shift of the emitted light. As the physical sizes of LEDs are further reduced, efficiency losses due to surface recombination near the etched sidewall facets that include surface imperfections may become much more significant. III-phosphide materials, such as AlGaInP, can have a high surface recombination velocity and minority carrier diffusion length. For example, carriers in AlGaInP can have high diffusivity (mobility), and AlGaInP may have an order of magnitude higher surface recombination velocity than III-nitride materials. Thus, the internal and external quantum efficiencies of AlGaInP-based red light-emitting LEDs may drop even more significantly as the device size reduces.

In addition, at the light-emitting surface of an LED, such as the interface between the LED and air, incident light with incident angles greater than a critical angle may be reflected back to the LED due to total internal reflection (TIR). Because of the geometry of the LED, some light reflected back to the LED may be trapped and eventually be absorbed by the LED. For example, some trapped light may be absorbed by the semiconductor materials to generate electron-hole pairs, which may recombine radiatively or non-radiatively. Some trapped light may be absorbed by metals (e.g., metal contacts or reflectors) at the bottom and/or sidewalls of the LED due to, for example, surface plasmon resonance that may be excited by p-polarized light at the interface between a metal layer and a dielectric layer (e.g., the passivation layer). In III-phosphide-based LEDs, such as some red light-emitting III-phosphide LEDs, the refractive indices of the III-phosphide semiconductor materials (e.g., GaP, InP, GaInP, or AlGaInP) may be greater than about 3.0 (e.g., about 3.4 or 3.5) for visible light, much higher than the refractive indices of many III-nitride semiconductor materials (e.g., about 2.4 for GaN). Therefore, the critical angle for total internal reflection at the interface between the III-phosphide semiconductor material and an adjacent lower refractive index material (e.g., air or a dielectric) may be much smaller than the critical angle for total internal reflection at the interface between a III-nitride semiconductor material and the lower refractive index material. As such, more light emitted in the active region of a III-phosphide-based LED may be trapped in the LED due to TIR and may eventually be absorbed by the LED. Therefore, the LEE of a red light-emitting III-phosphide LED may be low.

Micro-lenses may be used to extract and collimate light emitted from LEDs to increase the total LEEs (e.g., for extracted light with emission angles within ±90°) and the collected LEEs (e.g., for extracted light with emission angles within ±18.5°) of LEDs in a near-eye display. However, when the size of light emitting region of a micro-LED is close to the size of the micro-lens, the light extraction efficiency may be low and the output light beam may not be well collimated because the light emitting region may not appear to be a point source with respect to the micro-lens. Therefore, the collected LEE may be low. Reducing the size of the mesa structure (and thus the light emitting region) of a micro-LED such that the light emitting region may be closer to being a point source for the micro-lens may improve the light extraction efficiency, but may also significantly reduce the internal quantum efficiency due to high non-radiative recombination at the mesa sidewalls, and thus the overall external quantum efficiency of the micro-LED may not be improved. In addition, the emitted light beam may still not be well collimated, and thus the collected LEE (e.g., within about ±18.5°) may still be low.

According to certain embodiments, micro-LEDs may be fabricated by growing active layers in cavities formed in a dielectric layer or distributed Bragg reflector (DBR) layers, using epitaxial regrowth processes that do not involve etching the epitaxial layers. The cavities can be small and thus the active regions of the micro-LEDs can be small. As a result, the light-emitting region of a micro-LED may be close to a point source with respect to the micro-lens, and thus light emitted from the active region may be better collimated and collected by the display optics of a near-eye display. Because the active layers are not etched, they may have lower defect densities at the sidewalls such that non-radiative recombination at the sidewalls of the active regions may be reduced and thus the efficiencies of the micro-LEDs may be improved, even though the active regions may be small. In addition, when the size of the active region is reduced, the current density may increase with the same injection current. For micro-LEDs with small active regions (e.g., with widths below about 4 μm), increasing the current density may increase the IQEs and EQEs. Furthermore, since cavities with desired locations, sizes, and shapes can be relatively easily etched in the dielectric layer or the DBR layers, the active regions of the micro-LEDs regrown in the cavities can have the desired locations, sizes, and shapes defined by the cavities to counteract optical aberrations of the micro-lens, such that the emitted light may be better collimated by the micro-lenses and may be collected by the display optics at higher efficiencies.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an antireflective coating, a reflective coating, a filtering coating, or a combination of different optical coatings.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices).

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120.

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. Artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to determine the eye's orientation more accurately.

Figure 2:
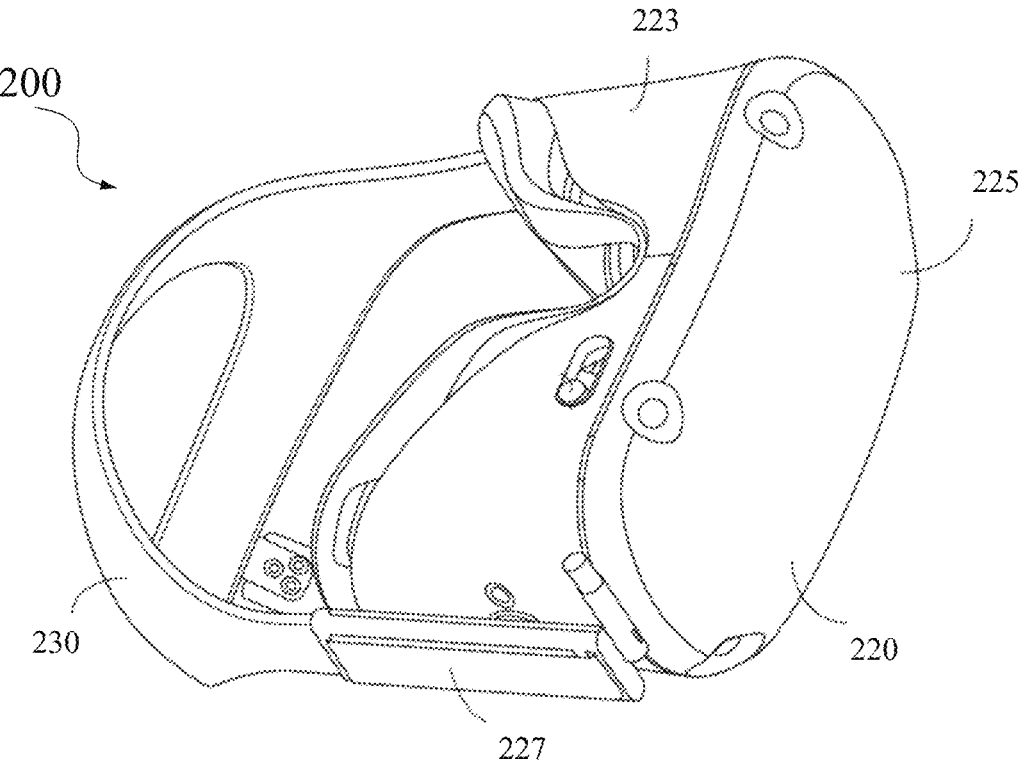
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
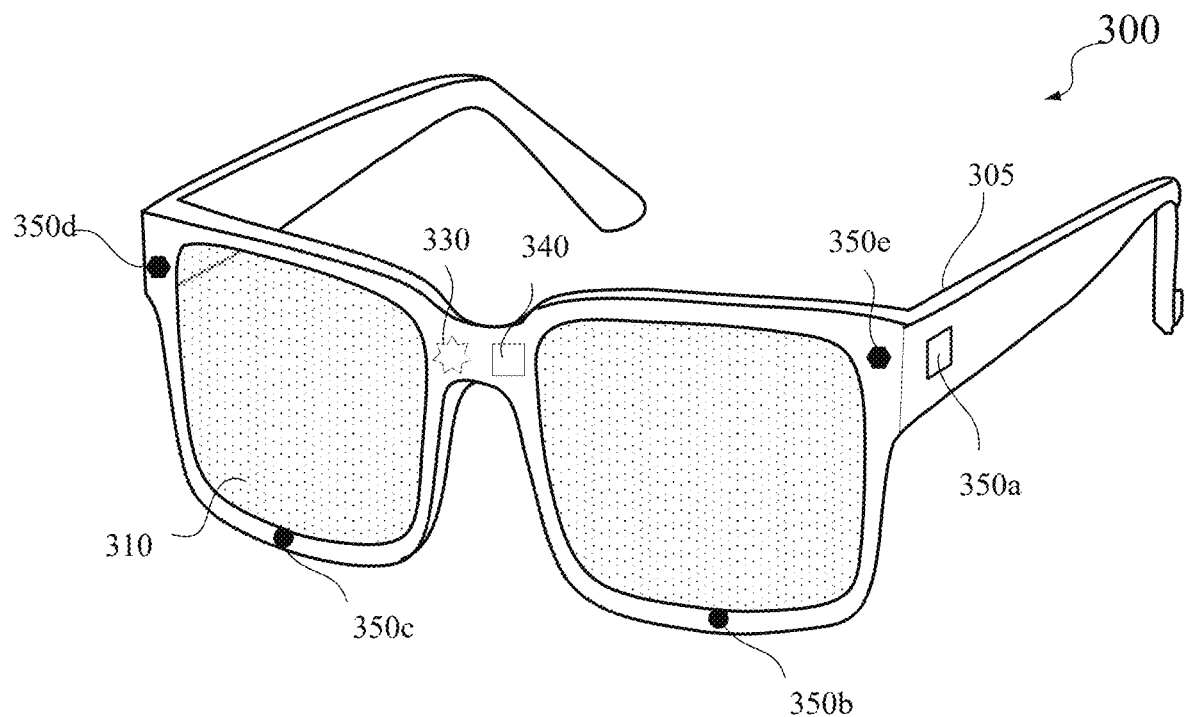
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
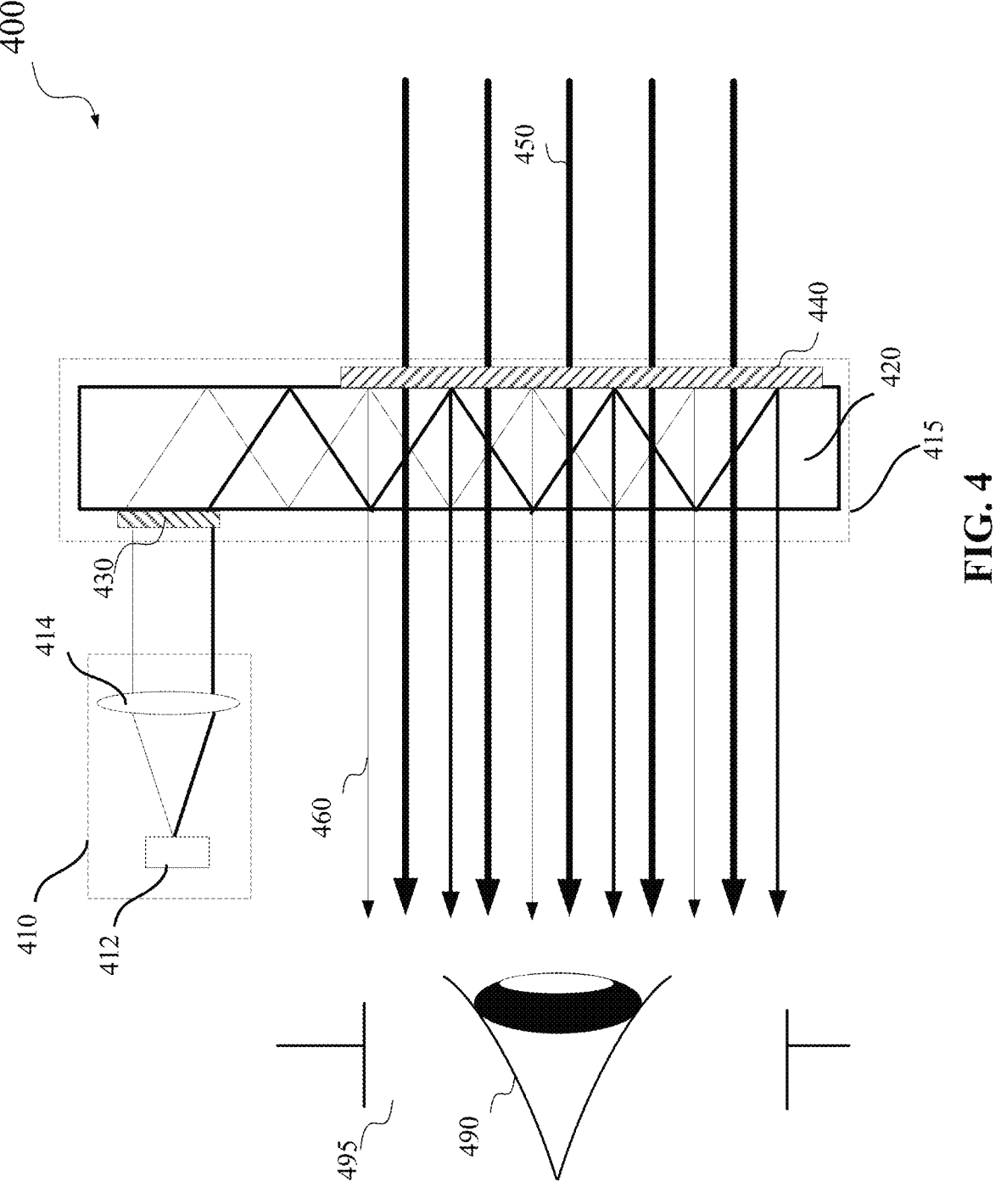
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figures 5A, 5B:
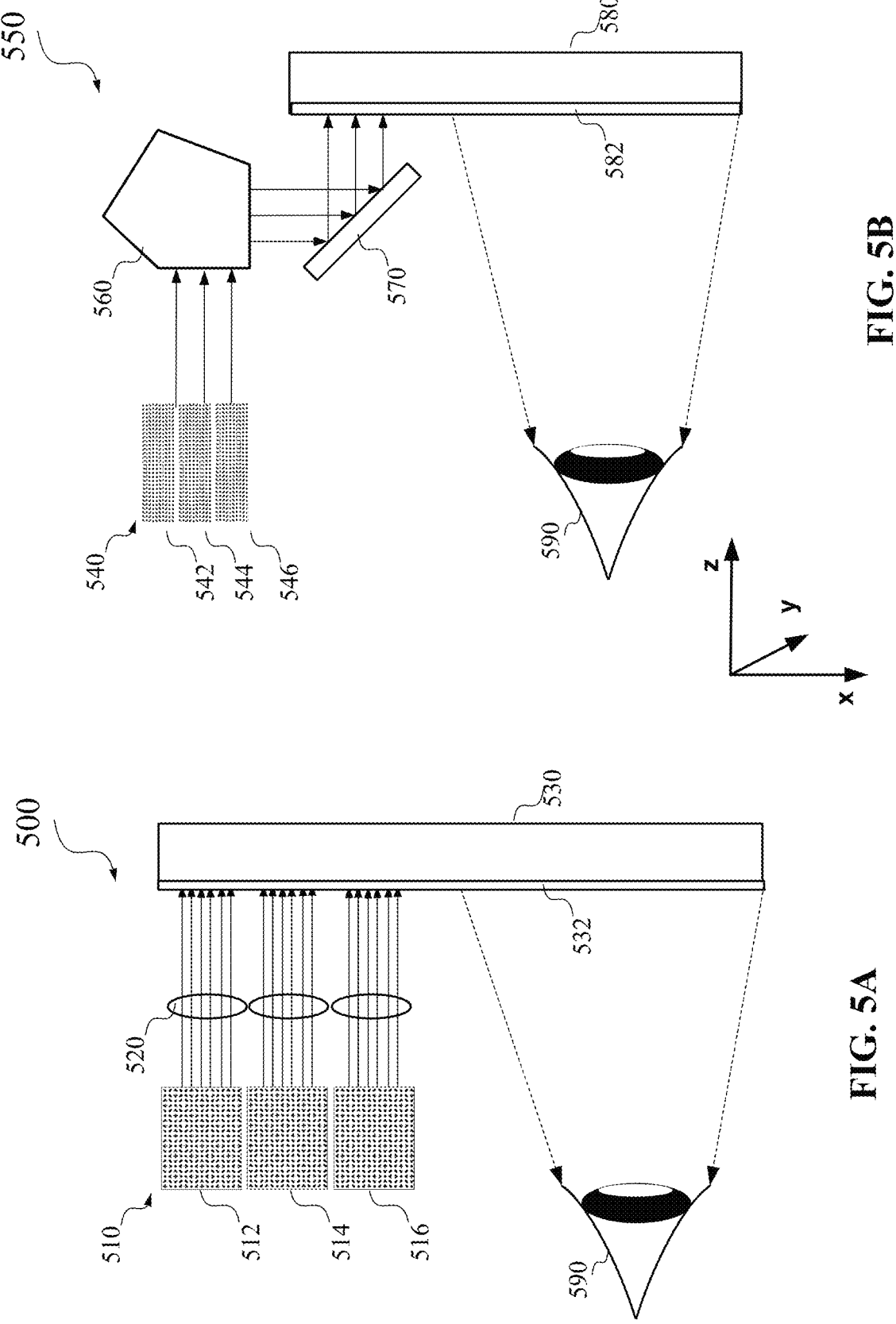
FIG. 5A illustrates an example of a near-eye display device including a waveguide display according to certain embodiments.
FIG. 5B illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
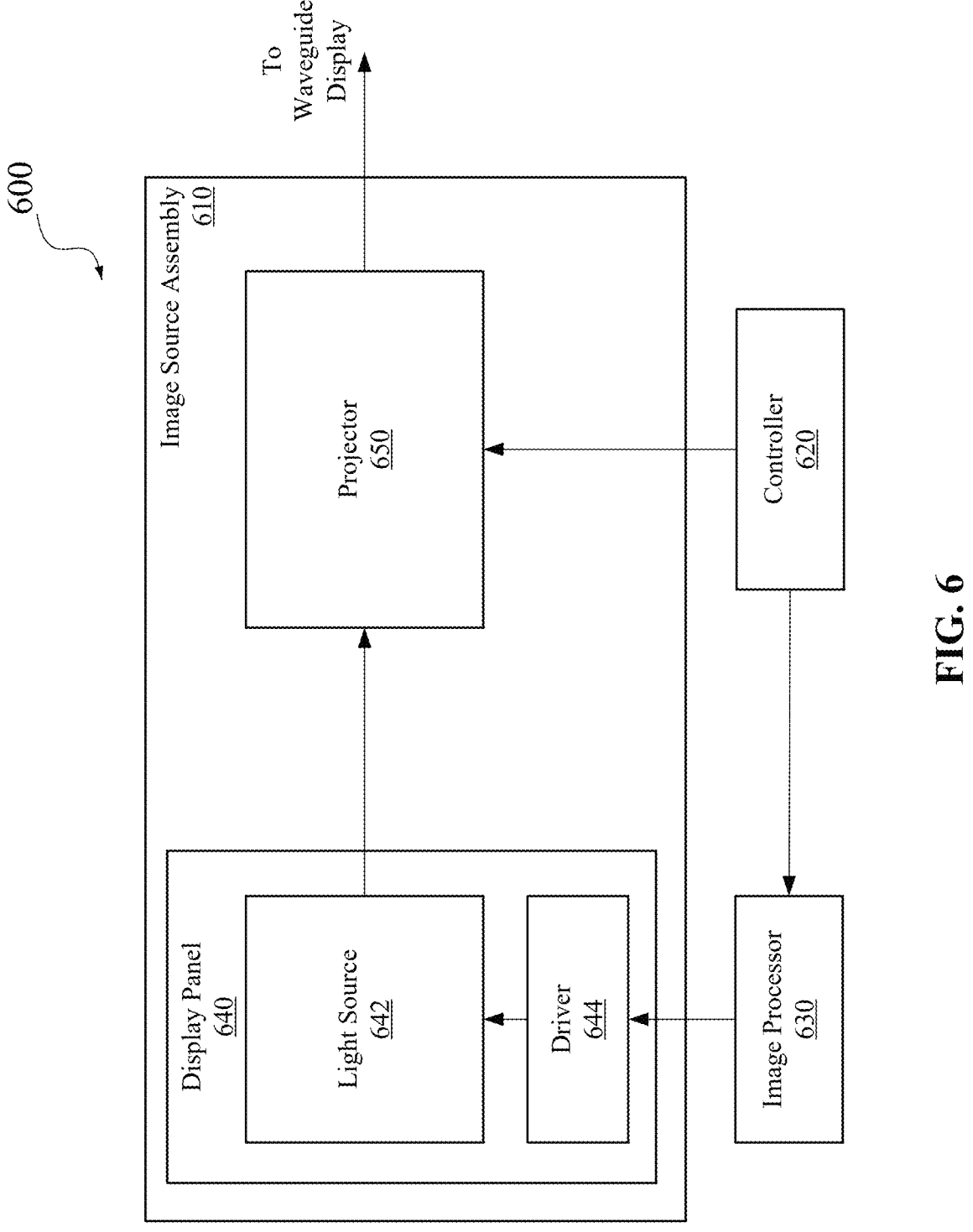
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a drive circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and drive circuit 644, image processor 630 may be a sub-unit of controller 620 or drive circuit 644 in other embodiments. In other words, in those embodiments, controller 620 or drive circuit 644 may perform various image processing functions of image processor 630. Image processor 630 may also be referred to as an image processing circuit.

In the example shown in FIG. 6, light source 642 may be driven by drive circuit 644, based on data or instructions (e.g., display and scanning instructions) sent from controller 620 or image processor 630. In one embodiment, drive circuit 644 may include a circuit panel that connects to and mechanically holds various light emitters of light source 642. Light source 642 may emit light in accordance with one or more illumination parameters that are set by the controller 620 and potentially adjusted by image processor 630 and drive circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

Figure 7A:
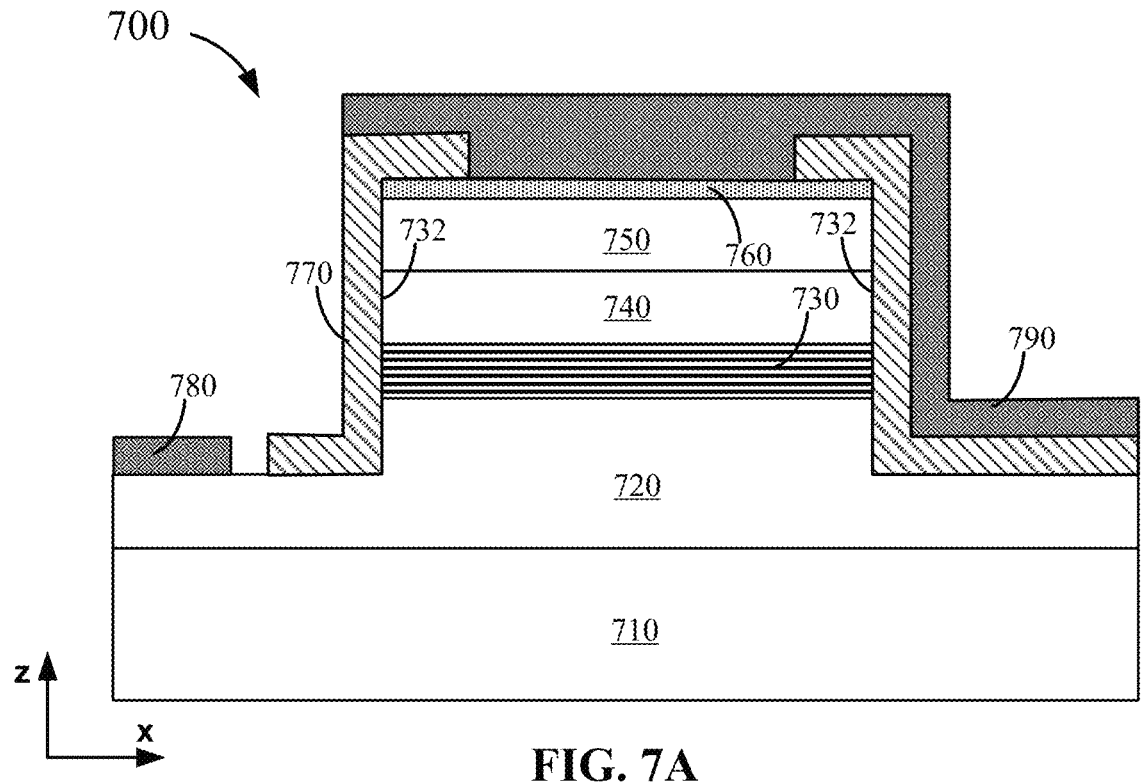
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
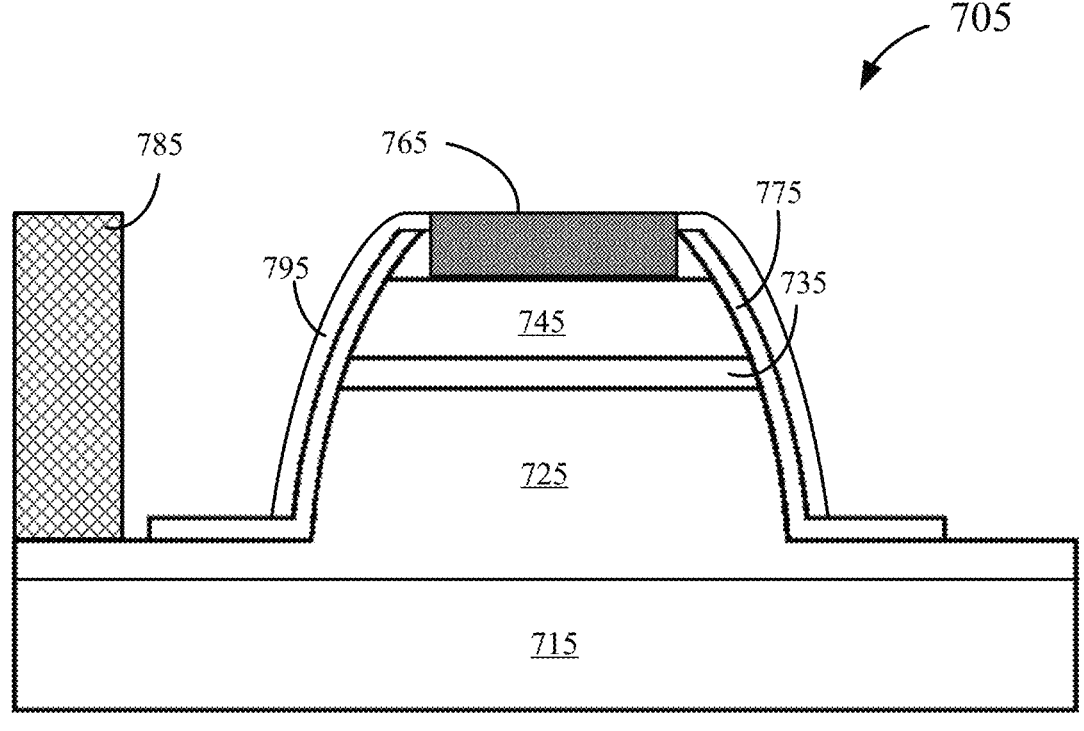
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiN) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Drive circuits (e.g., drive circuit 644) may be fabricated, for example, on a silicon wafer using CMOS processes. The LEDs and the drive circuits on wafers may be diced and then bonded together, or may be bonded on the wafer level and then diced. Various bonding techniques can be used for bonding the LEDs and the drive circuits, such as adhesive bonding, metal-to-metal bonding, metal oxide bonding, wafer-to-wafer bonding, die-to-wafer bonding, hybrid bonding, and the like.

Figures 8A, 8B, 8C, 8D:
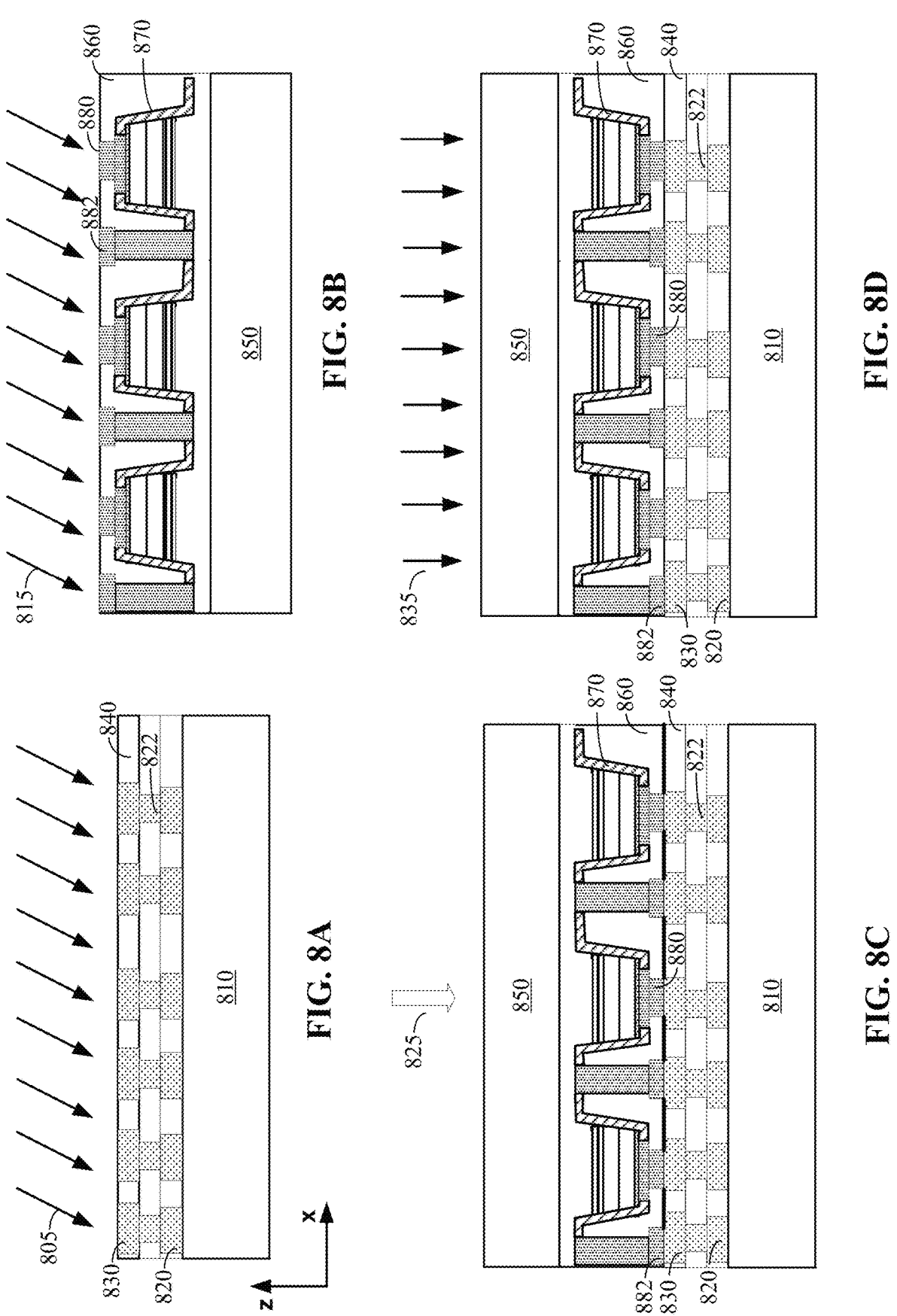
FIGS. 8A-8D illustrate an example of a method of hybrid bonding for arrays of LEDs according to certain embodiments.

FIGS. 8A-8D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 8A shows a substrate 810 with passive or active circuits 820 manufactured thereon. As described above with respect to FIGS. 8A-8B, substrate 810 may include, for example, a silicon wafer. Circuits 820 may include drive circuits for the arrays of LEDs. A bonding layer may include dielectric regions 840 and contact pads 830 connected to circuits 820 through electrical interconnects 822. Contact pads 830 may include, for example, Cu, Ag, Au, Al, W, Mo, Ni, Ti, Pt, Pd, or the like. Dielectric materials in dielectric regions 840 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 805. The activated surface may be atomically clean and may be reactive for formation of direct bonds between wafers when they are brought into contact, for example, at room temperature.

FIG. 8B illustrates a wafer 850 including an array of micro-LEDs 870 fabricated thereon as described above with respect to, for example, FIGS. 7A-8B. Wafer 850 may be a carrier wafer and may include, for example, GaAs, InP, GaN, AlN, sapphire, SiC, Si, or the like. Micro-LEDs 870 may include an n-type layer, an active region, and a p-type layer epitaxially grown on wafer 850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 880 and n-contacts 882 may be formed in a dielectric material layer 860 deposited on the mesa structures and may make electrical contacts with the p-type layer and the n-type layers, respectively. Dielectric materials in dielectric material layer 860 may include, for example, SiCN, $SiO_2$, SiN, $Al_2O_3$, $HfO_2$, $ZrO_2$, $Ta_2O_5$, or the like. P-contacts 880 and n-contacts 882 may include, for example, Cu, Ag, Au, Al, W, Mo, Ni, Ti, Pt, Pd, or the like. The top surfaces of p-contacts 880, n-contacts 882, and dielectric material layer 860 may form a bonding layer. The bonding layer may be planarized and polished using, for example, chemical mechanical polishing, where the polishing may cause dishing in p-contacts 880 and n-contacts 882. The bonding layer may then be cleaned and activated by, for example, an ion (e.g., plasma) or fast atom (e.g., Ar) beam 815. The activated surface may be atomically clean and reactive for formation of direct bonds between wafers when they are brought into contact, for example, at room temperature.

FIG. 8C illustrates a room temperature bonding process for bonding the dielectric materials in the bonding layers. For example, after the bonding layer that includes dielectric regions 840 and contact pads 830 and the bonding layer that includes p-contacts 880, n-contacts 882, and dielectric material layer 860 are surface activated, wafer 850 and micro-LEDs 870 may be turned upside down and brought into contact with substrate 810 and the circuits formed thereon. In some embodiments, compression pressure 825 may be applied to substrate 810 and wafer 850 such that the bonding layers are pressed against each other. Due to the surface activation and the dishing in the contacts, dielectric regions 840 and dielectric material layer 860 may be in direct contact because of the surface attractive force, and may react and form chemical bonds between them because the surface atoms may have dangling bonds and may be in unstable energy states after the activation. Thus, the dielectric materials in dielectric regions 840 and dielectric material layer 860 may be bonded together with or without heat treatment or pressure.

FIG. 8D illustrates an annealing process for bonding the contacts in the bonding layers after bonding the dielectric materials in the bonding layers. For example, contact pads 830 and p-contacts 880 or n-contacts 882 may be bonded together by annealing at, for example, about 200-400° C. or higher. During the annealing process, heat 835 may cause the contacts to expand more than the dielectric materials (due to different coefficients of thermal expansion), and thus may close the dishing gaps between the contacts such that contact pads 830 and p-contacts 880 or n-contacts 882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of substrate, or the like, before bonding.

After the micro-LEDs are bonded to the drive circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 9:
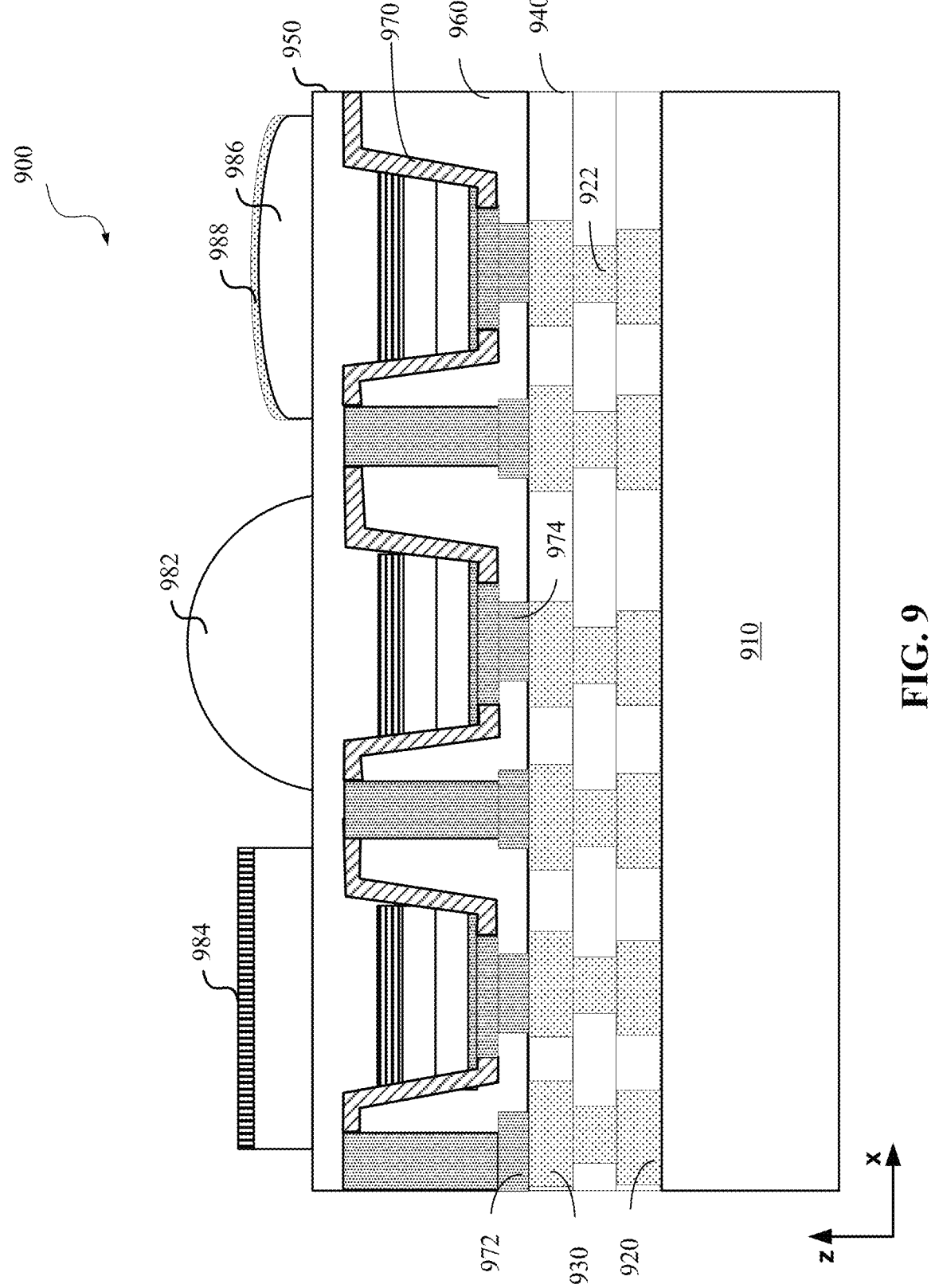
FIG. 9 illustrates an example of an LED array with secondary optical components fabricated thereon according to certain embodiments.

FIG. 9 illustrates an example of an LED array 900 with secondary optical components fabricated thereon according to certain embodiments. LED array 900 may be made by bonding an LED chip or wafer with a silicon wafer including electrical circuits fabricated thereon, using any suitable bonding techniques described above with respect to, for example, FIGS. 8A-8D. In the example shown in FIG. 9, LED array 900 may be bonded using a wafer-to-wafer hybrid bonding technique as described above with respect to FIG. 8A-8D. LED array 900 may include a substrate 910, which may be, for example, a silicon wafer. Integrated circuits 920, such as LED drive circuits, may be fabricated on substrate 910. Integrated circuits 920 may be connected to p-contacts 974 and n-contacts 972 of micro-LEDs 970 through interconnects 922 and contact pads 930, where contact pads 930 may form metallic bonds with p-contacts 974 and n-contacts 972. Dielectric layer 940 on substrate 910 may be bonded to dielectric layer 960 through fusion bonding.

The substrate (not shown) of the LED chip or wafer may be thinned or may be removed to expose the n-type layer 950 of micro-LEDs 970. Various secondary optical components, such as a spherical micro-lens 982, a grating 984, a micro-lens 986, an antireflection layer 988, and the like, may be formed in or on top of n-type layer 950. For example, spherical micro-lens arrays may be etched in the semiconductor materials of micro-LEDs 970 using a gray-scale mask and a photoresist with a linear response to exposure light, or using an etch mask formed by thermal reflowing of a patterned photoresist layer. The secondary optical components may also be etched in a dielectric layer deposited on n-type layer 950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, SiO$_2$, SiN, Al$_2$O$_3$, HfO$_2$, ZrO$_2$, Ta$_2$O$_5$, or the like. In some embodiments, a micro-LED 970 may have multiple corresponding secondary optical components, such as a micro-lens and an antireflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 9 to show some examples of secondary optical components that can be formed on micro-LEDs 970, which does not necessary imply that different secondary optical components are used simultaneously for every LED array.

Figures 10A, 10B:
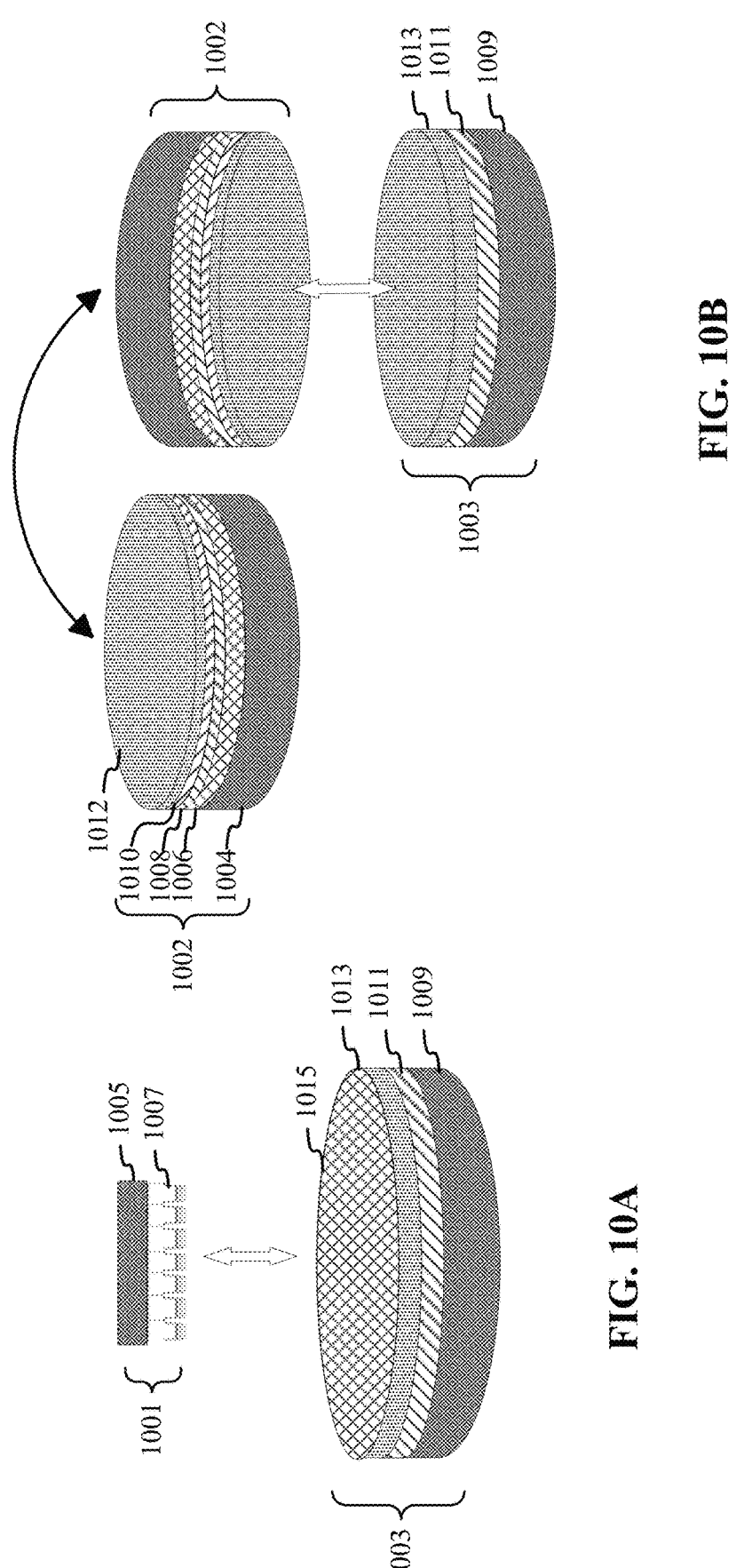
FIG. 10A illustrates an example of a method of die-to-wafer bonding for arrays of LEDs according to certain embodiments.
FIG. 10B illustrates an example of a method of wafer-to-wafer bonding for arrays of LEDs according to certain embodiments.

FIG. 10A illustrates an example of a method of die-to-wafer bonding for arrays of LEDs according to certain embodiments. In the example shown in FIG. 10A, an LED array 1001 may include a plurality of LEDs 1007 on a carrier substrate 1005. Carrier substrate 1005 may include various materials, such as GaAs, InP, GaN, AlN, sapphire, SiC, Si, or the like. LEDs 1007 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1003 may include a base layer 1009 having passive or active integrated circuits (e.g., drive circuits 1011)

fabricated thereon. Base layer 1009 may include, for example, a silicon wafer. Drive circuits 1011 may be used to control the operations of LEDs 1007. For example, the drive circuit for each LED 1007 may include a 2TIC pixel structure that has two transistors and one capacitor. Wafer 1003 may also include a bonding layer 1013. Bonding layer 1013 may include various materials, such as a metal, an oxide, a dielectric, CuSn, AuTi, and the like. In some embodiments, a patterned layer 1015 may be formed on a surface of bonding layer 1013, where patterned layer 1015 may include a metallic grid made of a conductive material, such as Cu, Ag, Au, Al, or the like.

LED array 1001 may be bonded to wafer 1003 via bonding layer 1013 or patterned layer 1015. For example, patterned layer 1015 may include metal pads or bumps made of various materials, such as CuSn, AuSn, or nanoporous Au, that may be used to align LEDs 1007 of LED array 1001 with corresponding drive circuits 1011 on wafer 1003. In one example, LED array 1001 may be brought toward wafer 1003 until LEDs 1007 come into contact with respective metal pads or bumps corresponding to drive circuits 1011. Some or all of LEDs 1007 may be aligned with drive circuits 1011, and may then be bonded to wafer 1003 via patterned layer 1015 by various bonding techniques, such as metal-to-metal bonding. After LEDs 1007 have been bonded to wafer 1003, carrier substrate 1005 may be removed from LEDs 1007.

For high-resolution micro-LED display panel, due to the small pitches of the micro-LED array and the small dimensions of individual micro-LEDs, it can be challenging to electrically connect the drive circuits to the electrodes of the LEDs. For example, in the face-to-face bonding techniques describe above, it is difficult to precisely align the bonding pads on the micro-LED devices with the bonding pads on the drive circuits and form reliable bonding at the interfaces that may include both dielectric materials (e.g., SiO$_2$, SiN, or SiCN) and metal (e.g., Cu, Au, or Al) bonding pads. In particular, when the pitch of the micro-LED device is about 2 or 3 microns or lower, the bonding pads may have a linear dimension less than about 1 μm in order to avoid shorting to adjacent micro-LEDs and to improve bonding strength for the dielectric bonding. However, small bonding pads may be less tolerant to misalignments between the bonding pads, which may reduce the metal bonding area, increase the contact resistance (or may even be an open circuit), and/or cause diffusion of metals to the dielectric materials and the semiconductor materials. Thus, precise alignment of the bonding pads on surfaces of the micro-LED arrays and bonding pads on surfaces of CMOS backplane may be needed in the conventional processes. However, the accuracy of die-to-wafer or wafer-to-wafer bonding alignment using state-of-art equipment may be on the order of about 0.5 μm or about 1 μm, which may not be adequate for bonding the small-pitch micro-LED arrays (e.g., with a linear dimension of the bonding pads on the order of 1 μm or shorter) to CMOS drive circuits.

In some implementations, to avoid precise alignment for the bonding, a micro-LED wafer may be bonded to a CMOS backplane after the epitaxial layer growth and before the formation of individual micro-LED on the micro-LED wafer, where the micro-LED wafer and the CMOS backplane may be bonded through metal-to-metal bonding of two solid metal bonding layers on the two wafers. No alignment would be needed to bond the solid contiguous metal bonding layers. After the bonding, the epitaxial layers on the micro-LED wafer and the metal bonding layers may be etched to form individual micro-LEDs. The etching process may have much higher alignment accuracy and thus may form individual micro-LEDs that align with the underlying pixel drive circuits.

FIG. 10B illustrates an example of a method of wafer-to-wafer bonding for arrays of LEDs according to certain embodiments. As shown in FIG. 10B, a first wafer 1002 may include a substrate 1004, a first semiconductor layer 1006, active layers 1008, and a second semiconductor layer 1010. Substrate 1004 may include various materials, such as GaAs, InP, GaN, AlN, sapphire, SiC, Si, or the like. First semiconductor layer 1006, active layers 1008, and second semiconductor layer 1010 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1006 may be an n-type layer, and second semiconductor layer 1010 may be a p-type layer. For example, first semiconductor layer 1006 may be an n-doped GaN layer (e.g., doped with Si or Ge), and second semiconductor layer 1010 may be a p-doped GaN layer (e.g., doped with Mg, Ca, Zn, or Be). Active layers 1008 may include, for example, one or more GaN layers, one or more InGaN layers, one or more AlInGaP layers, and the like, which may form one or more heterostructures, such as one or more quantum wells or MQWs.

In some embodiments, first wafer 1002 may also include a bonding layer. Bonding layer 1012 may include various materials, such as a metal, an oxide, a dielectric, CuSn, AuTi, or the like. In one example, bonding layer 1012 may include p-contacts and/or n-contacts (not shown). In some embodiments, other layers may also be included on first wafer 1002, such as a buffer layer between substrate 1004 and first semiconductor layer 1006. The buffer layer may include various materials, such as polycrystalline GaN or AlN. In some embodiments, a contact layer may be between second semiconductor layer 1010 and bonding layer 1012. The contact layer may include any suitable material for providing an electrical contact to second semiconductor layer 1010 and/or first semiconductor layer 1006.

First wafer 1002 may be bonded to wafer 1003 that includes drive circuits 1011 and bonding layer 1013 as described above, via bonding layer 1013 and/or bonding layer 1012. Bonding layer 1012 and bonding layer 1013 may be made of the same material or different materials. Bonding layer 1013 and bonding layer 1012 may be substantially flat. First wafer 1002 may be bonded to wafer 1003 by various methods, such as metal-to-metal bonding, eutectic bonding, metal oxide bonding, anodic bonding, thermo-compression bonding, ultraviolet (UV) bonding, and/or fusion bonding.

As shown in FIG. 10B, first wafer 1002 may be bonded to wafer 1003 with the p-side (e.g., second semiconductor layer 1010) of first wafer 1002 facing down (i.e., toward wafer 1003). After bonding, substrate 1004 may be removed from first wafer 1002, and first wafer 1002 may then be processed from the n-side. The processing may include, for example, the formation of certain mesa shapes for individual LEDs, as well as the formation of optical components corresponding to the individual LEDs.

Figures 11A, 11B, 11C, 11D, 11E, 11F:
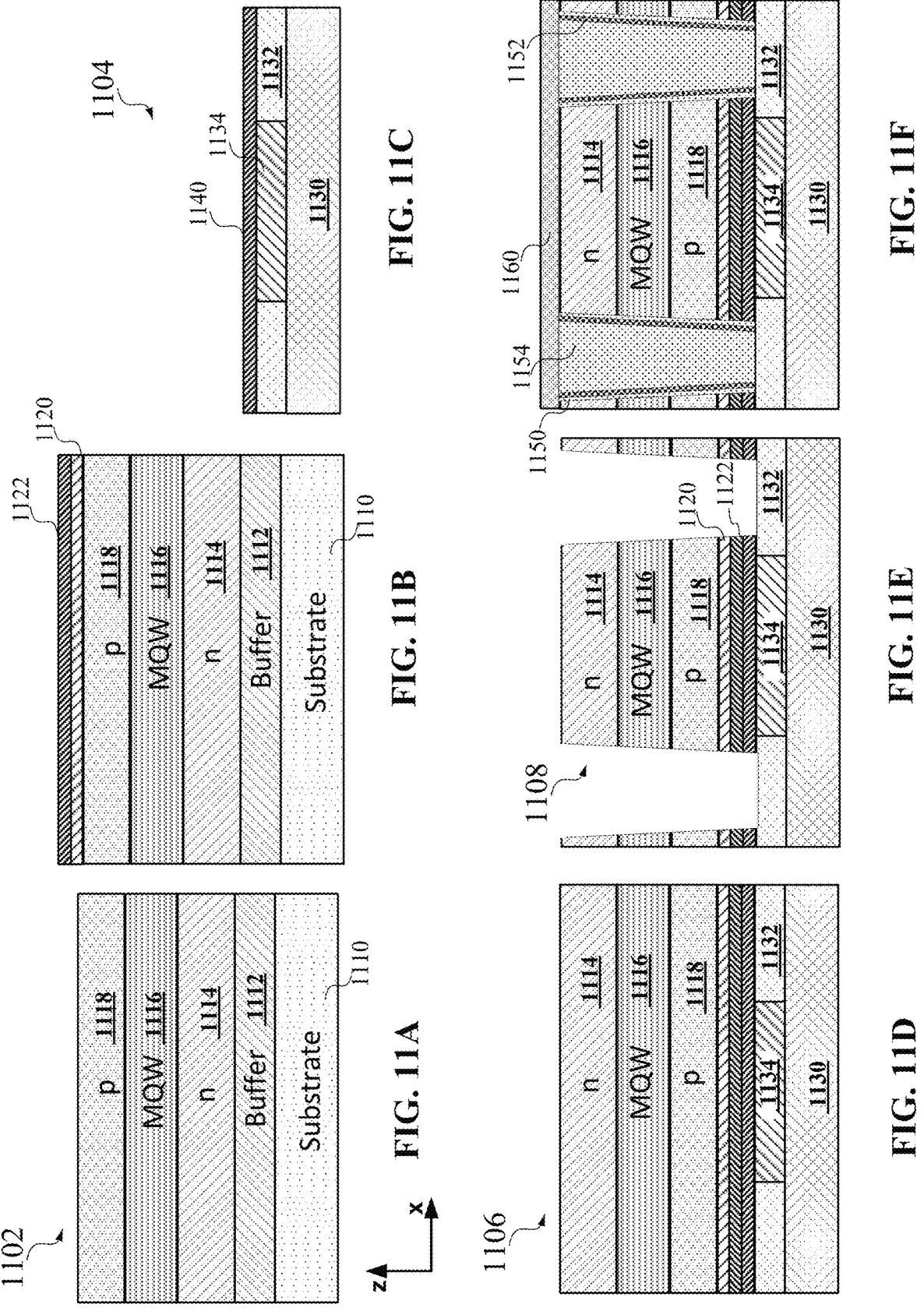
FIGS. 11A-11F illustrate an example of a method of fabricating a micro-LED device using alignment-free metal-to-metal bonding and post-bonding mesa formation.

FIGS. 11A-11F illustrate an example of a method of fabricating a micro-LED device using alignment-free metal-to-metal bonding and post-bonding mesa formation processes. FIG. 11A shows a micro-LED wafer 1102 including epitaxial layers grown on a substrate 1110. As described above, substrate 1110 may include, for example, a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane (e.g., a c-plane or a semipolar plane) as the growth surface. In some embodiments, a buffer layer 1112 may be formed on substrate 1110 to improve the lattice matching between the growth substrate and the epitaxial layers, thereby reducing stress and defects in the epitaxial layers. The epitaxial layers may include an n-type semiconductor layer 1114 (e.g., a GaN layer doped with Si or Ge), an active region 1116, and a p-type semiconductor layer 1118 (e.g., a GaN layer doped with Mg, Ca, Zn, or Be). Active region 1116 may include multiple quantum wells or an MQW formed by quantum well layers (e.g., InGaN layer) sandwiched by barrier layers (e.g., GaN layer) as described above. The epitaxial layers may be grown layer-by-layer on substrate 1110 or buffer layer 1112 using techniques such as VPE, LPE, MBE, or MOCVD.

In the epitaxial growth processes, dopants (e.g., Mg) used to dope the p-type semiconductor layer (e.g., Mg-doped GaN layer) may remain in the reactor and/or on the epitaxial surface after the introduction of Mg precursors into the reactor. For example, the source for Mg doping (e.g., bis (cyclopentadienyl) magnesium (Cp$_2$Mg)) may be adsorbed onto reactor lines and walls and may be released in the gas phase in subsequent processes. A surface riding effect can also contribute to the residual Mg due to a Mg-rich layer formed on the surface of the p-GaN layer. Thus, if the quantum-well layers are grown on the Mg-rich p-GaN layer after the growth of the p-GaN layer with Mg dopants, the quantum-well layers may be contaminated with Mg dopants even after the Mg source is turned off, which may be referred to as the Mg-memory effect and may manifest as a slow decay tail of Mg into subsequent epitaxial layers. Mg can contaminate the MQW layers to form non-radiative recombination centers caused by, for example, Mg-related point defects, Mg interstitials, or Mg-related complexes.

In addition, for p-type GaN layers formed using, for example, MOCVD, the dopants (e.g., Mg) may be passivated due to the incorporation of atomic hydrogen (which exists in the form of H*) during growth and the formation of Mg—H complexes. Therefore, a post-growth activation of the dopants is generally performed to release mobile holes. The activation of the dopants in the p-GaN layer may include breaking the Mg—H bonds and driving the H$^+$ out of the p-GaN layer at elevated temperatures (e.g., above 700° C.) to activate the Mg dopants. Insufficient activation of the Mg dopants in the p-GaN layer may lead to an open circuit, a poor performance, or a premature punch-through breakdown of the LED device. If p-type GaN layer is grown before the growth of the active region and the n-type layer, to drive out hydrogen, positively charged H$^+$ ions need to diffuse across the p-n junction and through the n-GaN layer that is exposed. However, because of the depletion field in the p-n junction (with a direction from the n-type layer to the p-type layer), positively charged H$^+$ ions may not be able to diffuse from the p-type layer to the n-type layer across the p-n junction. Furthermore, hydrogen may have a much higher diffusion barrier and thus a much lower diffusivity in n-type GaN compared with in p-type GaN. Thus, the hydrogen ions may not diffuse through the n-type layer to the exposed top surface of the n-type layer. Moreover, the activation may not be performed right after the p-doping and before the growth of the active region either, because the subsequent growth may be performed in the presence of high pressure ammonia (NH$_3$) in order to avoid decomposition of GaN at the high growth temperatures, and thus a semiconductor layer (e.g., the p-type semiconductor layer) that was activated may be re-passivated due to the presence of ammonia.

Therefore, in general, during the growth of the epitaxial layers, n-type semiconductor layer 1114 may be grown first. P-type semiconductor layer 1118 may be grown after the growth of active region 1116 to avoid contamination of active region 1116 and facilitate activation of the dopants in the p-type semiconductor layer.

FIG. 11B shows a reflector layer 1120 and a bonding layer 1122 formed on p-type semiconductor layer 1118. Reflector layer 1120 may include, for example, a metal layer such as an aluminum layer, a silver layer, or a metal alloy layer. In some embodiments, reflector layer 1120 may include a distributed Bragg reflector formed by conductive materials (e.g., semiconductor materials or conductive oxides) or including conductive vias. In some embodiments, reflector layer 1120 may include one or more sublayers. Reflector layer 1120 may be formed on p-type semiconductor layer 1118 in a deposition process. Bonding layer 1122 may include a metal layer, such as a titanium layer, a copper layer, an aluminum layer, a gold layer, or a metal alloy layer. In some embodiments, bonding layer 1122 may include a eutectic alloy, such as Au—In, Au—Sn, Au—Ge, or Ag—In. Bonding layer 1122 may be formed on reflector layer 1120 by a deposition process and may include one or more sublayers.

FIG. 11C shows a backplane wafer 1104 that includes a substrate 1130 with electrical circuits formed thereon. The electrical circuits may include digital and analog pixel drive circuits for driving individual micro-LEDs. A plurality of metal pads 1134 (e.g., copper or tungsten pads) may be formed in a dielectric layer 1132 (e.g., including $SiO_2$ or SiN). In some embodiments, each metal pad 1134 may be an electrode (e.g., anode or cathode) for a micro-LED. In some embodiments, pixel drive circuits for each micro-LED may be formed in an area matching the size of a micro-LED (e.g., about 2 μm×2 μm), where the pixel drive circuits and the micro-LED may collectively form a pixel of a micro-LED display panel. Even though FIG. 11C only shows metal pads 1134 formed in one metal layer in one dielectric layer 1132, backplane wafer 1104 may include two or more metal layers formed in dielectric materials and interconnected by, for example, metal vias, as in many CMOS integrated circuits. In some embodiments, a planarization process, such as a chemical mechanical polishing (CMP) process, may be performed to planarize the exposed surfaces of metal pads 1134 and dielectric layer 1132. A bonding layer 1140 may be formed on dielectric layer 1132 and may be in physical and electrical contact with metal pads 1134. As bonding layer 1122, bonding layer 1140 may include a metal layer, such as a titanium layer, a copper layer, an aluminum layer, a gold layer, a metal alloy layer, or a combination thereof. In some embodiments, bonding layer 1140 may include a eutectic alloy. In some embodiments, only one of bonding layer 1140 or bonding layer 1122 may be used.

FIG. 11D shows that micro-LED wafer 1102 and backplane wafer 1104 may be bonded together to form a wafer stack 1106. Micro-LED wafer 1102 and backplane wafer 1104 may be bonded by the metal-to-metal bonding of bonding layer 1122 and bonding layer 1140. The metal-to-metal bonding may be based on chemical bonds between the metal atoms at the surfaces of the metal bonding layers. The metal-to-metal bonding may include, for example, thermocompression bonding, eutectic bonding, or transient liquid phase (TLP) bonding. The metal-to-metal bonding process may include, for example, surface planarization, wafer cleaning (e.g., using plasma or solvents) at room temperatures, and compression and annealing at elevated temperatures, such as about 250° C. or higher, to cause diffusion of atoms. In eutectic bonding, a eutectic alloy including two or more metals and with a eutectic point lower than the melting point of the two or more metals may be used for low-temperature wafer bonding. Because the eutectic alloy may become a liquid at the elevated temperature, eutectic bonding may be less sensitive to surface flatness irregularities, scratches, particles contamination, and the like. After the bonding, buffer layer 1112 and substrate 1110 may be thinned or removed by, for example, etching, back grinding, or laser lifting, to expose n-type semiconductor layer 1114.

FIG. 11E shows that wafer stack 1106 may be etched from the side of the exposed n-type semiconductor layer 1114 to form mesa structures 1108 for individual micro-LEDs. As shown in FIG. 11E, the etching may include etching through n-type semiconductor layer 1114, active region 1116, p-type semiconductor layer 1118, reflector layer 1120, and bonding layers 1122 and 1140, in order to singulate and electrically isolate mesa structures 1108. Thus, each singulated mesa structure 1108 may include n-type semiconductor layer 1114, active region 1116, p-type semiconductor layer 1118, reflector layer 1120, and bonding layers 1122 and 1140. To perform the etching, an etch mask layer may be formed on n-type semiconductor layer 1114. The etch mask layer may be patterned by aligning a photomask with the backplane wafer (e.g., using alignment marks on backplane wafer 1104) such that the patterned etch mask formed in the etch mask layer may align with metal pads 1134. Therefore, regions of the epitaxial layers and bonding layers above metal pads 1134 may not be etched. Dielectric layer 1132 may be used as the etch-stop layer for the etching. Even though FIG. 11E shows that mesa structures 1108 have substantially vertical sidewalls, mesa structures 1108 may have other shapes as described above, such as a conical shape, a parabolic shape, or a truncated pyramid shape.

FIG. 11F shows that a passivation layer 1150 may be formed on sidewalls of mesa structures 1108, and a sidewall reflector layer 1152 may be formed on passivation layer 1150. Passivation layer 1150 may include a dielectric layer (e.g., $SiO_2$, SiN, or $Al_2O_3$) or an undoped semiconductor layer. Sidewall reflector layer 1152 may include, for example, a metal (e.g., Al) or a metal alloy. In some embodiments, gaps between mesa structures 1108 may be filled with a dielectric material 1154 and/or a metal. Passivation layer 1150, sidewall reflector layer 1152, and/or dielectric material 1154 may be formed using suitable deposition techniques, such as chemical vapor deposition (CVD), physical vapor deposition (PVD), plasma-enhanced chemical vapor deposition (PECVD), atomic-layer deposition (ALD), laser metal deposition (LMD), or sputtering. In some embodiments, sidewall reflector layer 1152 may fill the gaps between mesa structures 1108. In some embodiments, a planarization process may be performed after the deposition of passivation layer 1150, sidewall reflector layer 1152, and/or dielectric material 1154. A common electrode layer 1160, such as a transparent conductive oxide (TCO) layer (e.g., an ITO layer) or a thin metal layer that may be transparent to light emitted in active region 1116, may be formed on the n-type semiconductor layer 1114 to form n-contacts and a common-cathode for the micro-LEDs. Even though not shown in FIG. 11F, an array of micro-lenses may be formed on common electrode layer 1160 to extract and collimate light emitted in active region 1116.

Figures 12A, 12B, 12C, 12D:
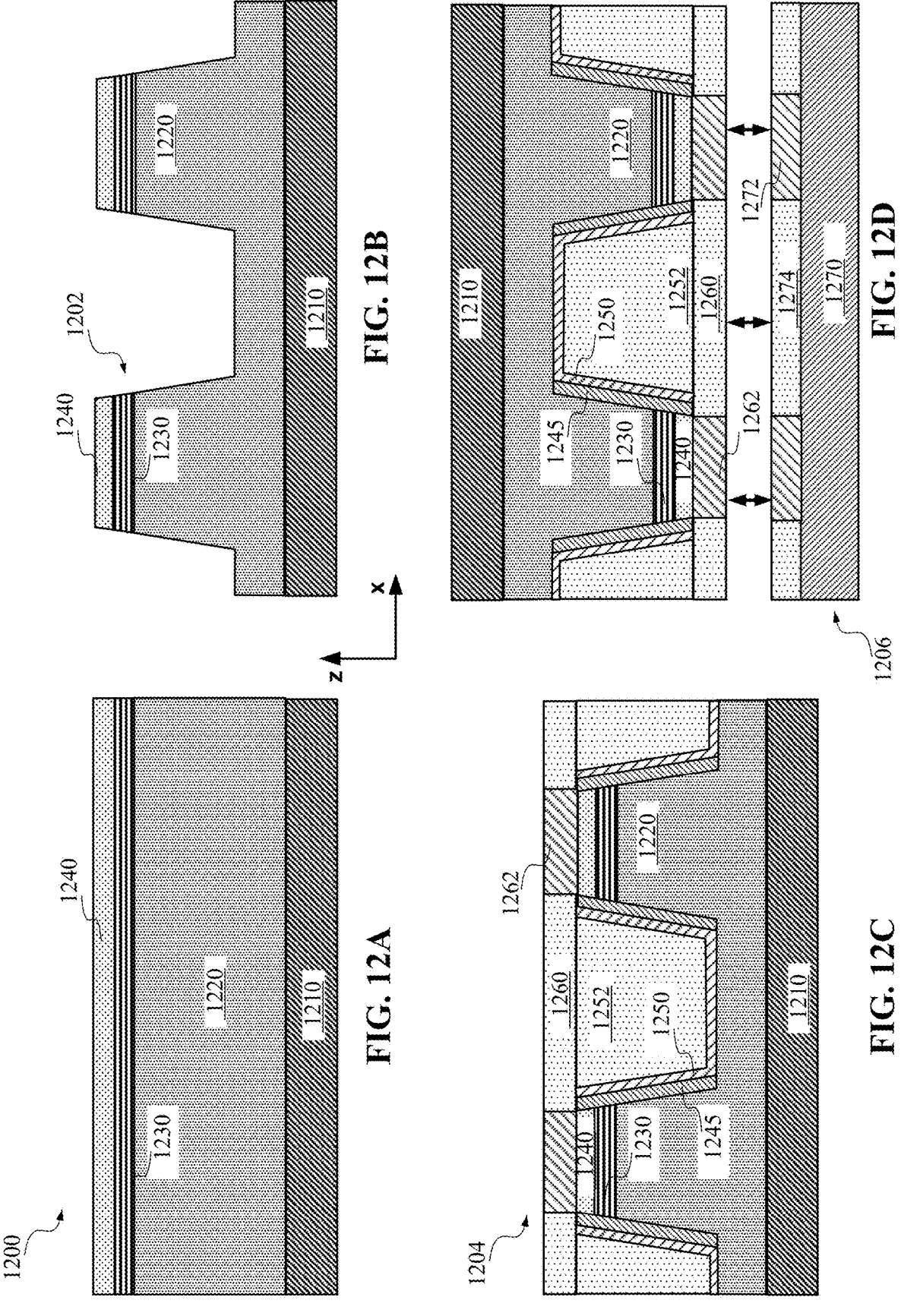
FIGS. 12A-12E illustrate an example of a process of fabricating a micro-LED device according to certain embodiments.

FIGS. 12A-12E illustrate an example of a process of fabricating a micro-LED device according to certain embodiments. FIG. 12A shows a micro-LED wafer 1200 including epitaxial layers grown on a substrate 1210. As described above, substrate 1210 may include, for example, a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane (e.g., a c-plane or a semipolar plane) as the growth surface. In some embodiments, a buffer layer may be formed on substrate 1210 to improve the lattice matching between the growth substrate and the epitaxial layers, thereby reducing stress and defects in the epitaxial layers. The epitaxial layers may include an n-type semiconductor layer 1220 (e.g., an n-doped GaN, AlInP, or AlGaInP layer), an active region 1230, and a p-type semiconductor layer 1240 (e.g., a p-doped GaN, AlInP, or AlGaInP layer). Active region 1230 may include multiple quantum wells or an MQW formed by thin quantum well layers (e.g., InGaN layers or GaInP layers) sandwiched by barrier layers (e.g., GaN layers, AlInP layers, or AlGaInP layers) as described above. The epitaxial layers may be grown layer-by-layer on substrate 1210 or the buffer layer using techniques such as VPE, LPE, MBE, or MOCVD. In some embodiments, n-type semiconductor layer 1220 may be much thicker than p-type semiconductor layer 1240.

FIG. 12B shows that micro-LED wafer 1200 may be etched from the side of p-type semiconductor layer 1240 to form semiconductor mesa structures 1202 for individual micro-LEDs. As shown in FIG. 12B, the etching may include etching through p-type semiconductor layer 1240, active region 1230, and at least a portion of n-type semiconductor layer 1220. Thus, each semiconductor mesa structure 1202 may include p-type semiconductor layer 1240, active region 1230, and a portion of n-type semiconductor layer 1220. To perform the etching, an etch mask layer may be formed on p-type semiconductor layer 1240, and dry or wet etching may be performed from the side of p-type semiconductor layer 1240. Due to the etching from p-type semiconductor layer 1240, semiconductor mesa structure 1202 may have sidewalls that are inwardly tilted in the z direction. For example, the angle between the sidewalls and the surface-normal direction (the z direction) of micro-LED wafer 1200 may be between about 0° to about 30°, such as about 15°. In some embodiments, semiconductor mesa structures 1202 may have a conical shape, a parabolic shape, a truncated pyramid shape, or another shape. In some embodiments, after the etching, sidewalls of the etched semiconductor mesa structures 1202 may be treated, for example, using KOH or an acid, to remove regions that may be damaged by high-energy ions during the dry etching.

FIG. 12C shows that micro-LED wafer 1200 may be further processed from the side of p-type semiconductor layer 1240 to form a wafer 1204 that includes an array of micro-LEDs. In the illustrated example, a passivation layer 1245 may be formed on sidewalls of semiconductor mesa structures 1202. Passivation layer 1245 may include, for example, $SiO_2$, SiN, $Al_2O_3$, or a semiconductor material. Passivation layer 1245 may electrically isolate semiconductor mesa structures 1202. A reflective metal layer 1250 (e.g., Al, Au, Ag, Cu, Ti, Ni, Pt, or a combination thereof) may be formed on passivation layer 1245 to optically isolate individual micro-LEDs and improve the light extraction efficiency. In some embodiments, reflective metal layer 1250 may fill regions between semiconductor mesa structures 1202. In some embodiments, a dielectric material 1252 (e.g., $SiO_2$) may be deposited on reflective metal layer 1250 and regions between semiconductor mesa structures 1202. Passivation layer 1245, reflective metal layer 1250, and dielectric material 1252 may be formed using suitable deposition techniques, such as chemical vapor deposition (CVD), physical vapor deposition (PVD), plasma-enhanced chemical vapor deposition (PECVD), atomic-layer deposition (ALD), laser metal deposition (LMD), or sputtering. A back reflector and p-contact 1262 may be form in a dielectric material 1260 and may contact p-type semiconductor layer 1240 of a corresponding semiconductor mesa structure 1202. Back reflector and p-contact 1262 may include, for example, Au, Ag, Al, Ti, Cu, Ni, ITO, or a combination thereof. Even though not shown in FIG. 12C, in some embodiments, one or more metal interconnect layers may be formed on back reflector and p-contact 1262. The one or more metal interconnect layers may include a bonding layer that includes metal bonding pads in a dielectric layer as described above with respect to, for example, FIG. 8B.

FIG. 12D shows that wafer 1204 may be bonded to a backplane wafer 1206 in a hybrid bonding process. Backplane wafer 1206 may include a substrate 1270 with electrical circuits formed thereon. The electrical circuits may include digital and analog pixel drive circuits for driving individual micro-LEDs. A plurality of metal pads 1272 (e.g., copper or tungsten pads) may be formed in a dielectric layer 1274 (e.g., including $SiO_2$ or SiN). In some embodiments, each metal pad 1272 may be an electrode (e.g., anode or cathode) for a micro-LED. Even though FIG. 12D only shows metal pads 1272 formed in one metal layer in one dielectric layer 1274, backplane wafer 1206 may include two or more metal layers formed in dielectric materials and interconnected by, for example, metal vias, as in many CMOS integrated circuits.

As described above with respect to, for example, FIGS. 8A-8D, the bonding surfaces of wafer 1204 and backplane wafer 1206 may be planarized, cleaned, and activated before the bonding. Wafer 1204 may be turned upside down and brought into contact with backplane wafer 1206 such that dielectric layer 1274 and dielectric material 1260 may be in direct contact and may be bonded together with or without heat treatment due to the surface activation. In some embodiments, a compression pressure may be applied to wafer 1204 and backplane wafer 1206 such that the bonding layers are pressed against each other. After the bonding of the dielectric materials, an annealing process may be performed at an elevated temperature to bond the metal pads (e.g., back reflector and p-contacts 1262 and metal pads 1272) at the bonding surfaces.

Figure 12E:
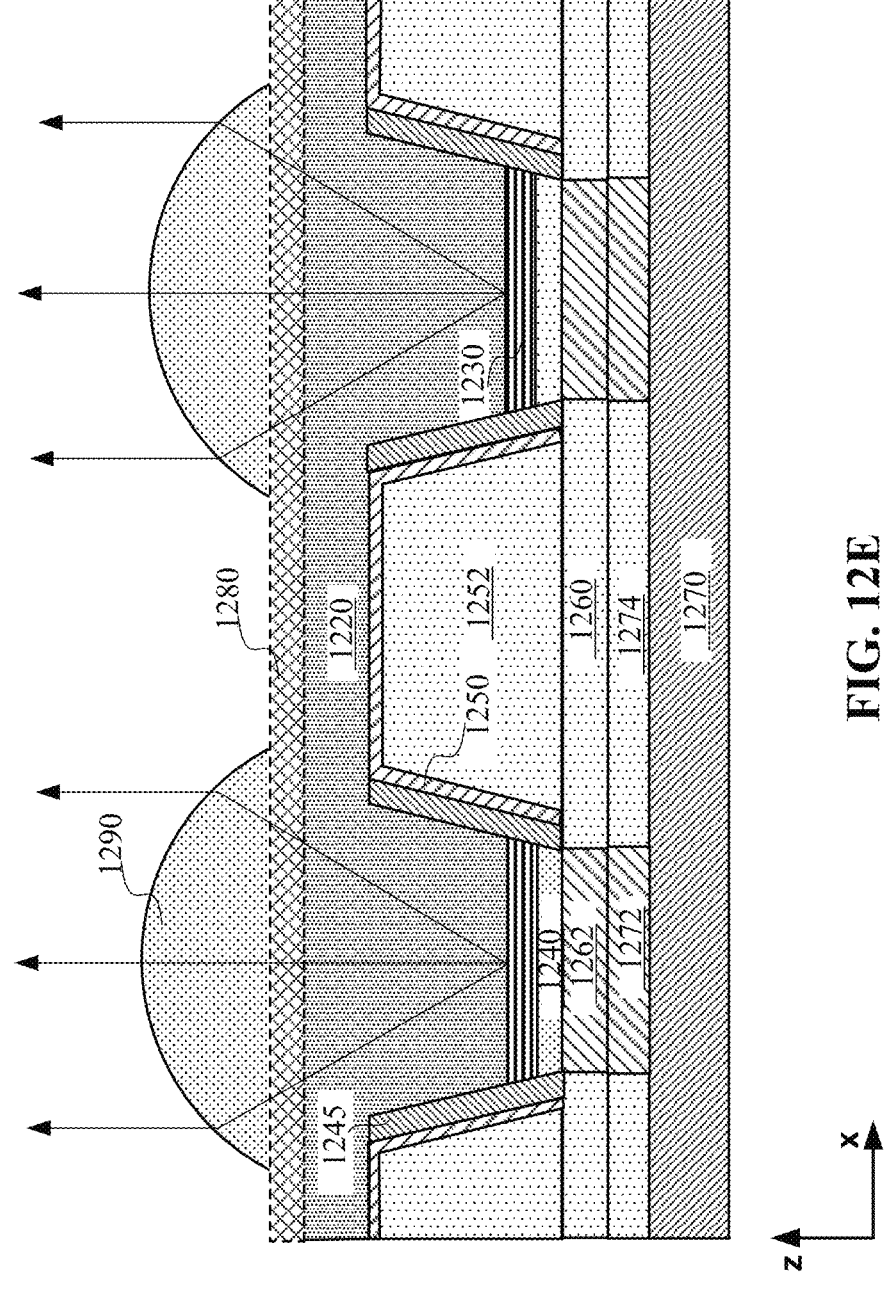

FIG. 12E shows that, after the bonding of wafer 1204 and backplane wafer 1206, substrate 1210 of wafer 1204 may be removed, and a transparent conductive oxide (TCO) layer 1280 (e.g., such as an ITO layer) may optionally be formed on the exposed n-type semiconductor layer 1220. TCO layer 1280 may form a common cathode for the micro-LEDs. In the illustrated example, non-native lenses 1290 may be fabricated in a dielectric material (e.g., SiN or $SiO_2$) or an organic material, and may be bonded to TCO layer 1280. In some embodiments, non-native lenses 1290 may be fabricated in a dielectric material deposited on TCO layer 1280. In some embodiments, native lenses may be fabricated in n-type semiconductor layer 1220, and the common cathode may be formed on the native lenses and/or may be the portion of n-type semiconductor layer 1220 that has not been etched (which can be heavily doped to reduce the resistance). As shown in FIGS. 12D and 12E, since wafer 1204 is turned upside down and bonded to backplane wafer 1206 and light may exit the micro-LEDs from the side of n-type semiconductor layer 1220, the semiconductor mesa structures of the micro-LEDs may have sidewalls that are outwardly tilted in the light emitting direction (e.g., the z direction).

As described above, in semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs including small semiconductor mesa structures formed in epitaxial layers to singulate the micro-LEDs, improving the internal and external quantum efficiency and/or controlling the emission spectrum may be challenging.

The internal quantum efficiency may indicate the proportion of the radiative electron-hole recombination in the active region that emits photons. The internal quantum efficiency of LEDs may depend on the relative rates of competitive radiative (light producing) recombination and non-radiative (lossy) recombination that occur in the active region of the LEDs. Non-radiative recombination processes in the active region may include Shockley-Read-Hall (SRH) recombination at defect sites and eeh/ehh Auger recombination that involves three carriers. The internal quantum efficiency of an LED may be approximately determined by:

$$IQE = \frac{BN^2}{AN + BN^2 + CN^3},$$

where A, B and C are the rates of SRH recombination, bimolecular (radiative) recombination, and Auger recombination, respectively, and N is the charge-carrier density (i.e., charge-carrier concentration) in the active region.

While the Auger recombination due to a high current density (and high charge carrier density) may be an intrinsic process depending on material properties, non-radiative SRH recombination depends on the characteristics and the quality of material, such as the defect density in the active region. As described above, LEDs may be fabricated by etching mesa structures into the active emitting layers to confine carriers within the mesa structures of the individual LEDs and to expose the n-type material beneath the active emitting layers for electrical contact. When mesa structures are etched (e.g., using high-energy ions such as $Ar^+$, $Cl_2^+$, $Cl^+$, or $HF^+$) to isolate individual LEDs, the facets of the mesa structure, such as mesa sidewalls 732, may include some defects, such as lattice dislocations, dangling bonds, pores, grain boundaries, vacancies, surface oxides, surfaces modified by plasma atoms, interstitial defects, substitutional defects, inclusion of precipitates, and the like. The defects may create energy levels that otherwise would not exist within the bandgap of the semiconductor material, causing non-radiative electron-hole recombination at or near the facets of the mesa structure. Thus, these imperfections may become the recombination centers where electrons and holes may be confined until they combine non-radiatively. Therefore, the active region in proximity to the exposed sidewalls may have a higher rate of non-radiative SRH recombination, thereby reducing the efficiency of the resulting LED. Due to the small size of the mesa structure, a larger proportion of the injected carriers may diffuse to regions near the mesa sidewalls and may be subjected to a higher non-radiative recombination rate. This may cause the peak efficiency of the LED to decrease significantly and/or cause the peak efficiency operating current to increase.

For traditional, broad area LEDs used in lighting and backlighting applications (e.g., with a lateral device area about 0.1 $mm^2$ to about 1 $mm^2$), the sidewalls are at the far ends of the devices. The devices can be designed such that little or no current is injected into regions within a minority carrier diffusion length from the mesa sidewalls, and thus the sidewall surface area to volume ratio and the overall rate of SRH recombination may be low. However, in micro-LEDs, as the size of the LED is reduced to a value comparable to or having a same order of magnitude as the minority carrier diffusion length, the increased surface area to volume ratio may lead to a high carrier surface recombination rate, because a greater proportion of the total active region may fall within the minority carrier diffusion length from the LED sidewalls. Therefore, more injected carriers may be subjected to the higher SRH recombination rate. This can cause the leakage current of the LED to increase and the efficiency of the LED to decrease as the size of the LED decreases, and/or cause the peak efficiency operating current to increase as the size of the LED decreases. For example, for a first LED with a 100 μm×100 μm×2 μm mesa, the side-wall surface area to volume ratio may be about 0.04. However, for a second LED with a 5 μm×5 μm×2 μm mesa, the side wall surface area to volume ratio may be about 0.8, which is about 20 times higher than the first LED. Thus, with a similar surface defect density, the SRH recombination coefficient of the second LED may be about 20 times higher as well. Therefore, the efficiency of the second LED may be significantly lower than the first LED.

In addition, at the light-emitting surface of an LED, such as the interface between the LED and air, incident light with incident angles greater than a critical angle may be reflected back to the LED due to total internal reflection (TIR). Because of the geometry of the LED, some light reflected back to the LED may be trapped and eventually be absorbed by the LED. For example, some trapped light may be absorbed by the semiconductor materials to generate electron-hole pairs, which may recombine radiatively or non-radiatively. Some trapped light may be absorbed by metals (e.g., metal contacts or reflectors) at the bottom and/or sidewalls of the LED due to, for example, surface plasmon resonance that may be excited by p-polarized light at the interface between a metal layer and a dielectric layer (e.g., the passivation layer). Because of the high refractive indices of many III-V semiconductor materials (e.g., about 2.4 for GaN, and greater than about 3.0 for GaP, InP, GaInP, and AlGaInP), the critical angle for total internal reflection at the interface between the III-V semiconductor material and an adjacent lower refractive index material (e.g., air or a dielectric) may be small. As such, a large portion of the light emitted in the active region of a III-V material-based LED may be trapped in the LED due to TIR and may eventually be absorbed by the LED. Therefore, the LEE of the micro-LED may be low. In large LEDs, the light extraction efficiency may be improved by using, for example, thin film technology or patterned sapphire substrates with dense, periodic patterns on the substrate surfaces, or rough light emitting surface, to randomize the propagation directions of the photons and increase the possibility of the photons being released from the confinement and exiting the mesa structure. However, these techniques may not be used in micro-LEDs with linear dimensions less than, for example, about 5 μm or about 3 μm, due to the small sizes and high aspect ratios (height vs width) of these micro-LEDs. For example, roughening the light emitting surface using KOH may generate features with sizes about a few microns, which may be comparable to or larger than the size of the mesa structure of a micro-LED, and thus may not randomize the incident light and may divert the incident light differently at different micro-LEDs.

Micro-lenses may be used to extract and collimate light emitted from LEDs to increase the total LEEs (e.g., for extracted light with emission angles within ±90°) and the collected LEEs (e.g., for extracted light with emission angles within ±18.5°) of LEDs in a near-eye display. However, when the size of light emitting region of a micro-LED is close to the size of the micro-lens, the light extraction efficiency may be low and the output light beam may not be well collimated because the light emitting region may not appear to be a point source with respect to the micro-lens. Therefore, the collected LEE may be low. Reducing the size of the mesa structure (and thus the light emitting region) of a micro-LED such that the light emitting region may be closer to being a point source for the micro-lens may improve the light extraction efficiency, but may also significantly reduce the internal quantum efficiency due to high non-radiative recombination at the mesa sidewalls, and thus the overall external quantum efficiency of the micro-LED may not be improved. In addition, the emitted light beam may still not be well collimated, and thus the collected LEE (e.g., within about ±18.5°) may still be low.

According to certain embodiments, micro-LEDs may be fabricated by growing active layers in cavities formed in a dielectric layer or distributed Bragg reflector (DBR) layers, using epitaxial regrowth processes that do not involve etching the epitaxial layers. The cavities can be small and thus the active regions of the micro-LEDs can be small. As a result, the light-emitting region of a micro-LED may be close to a point source with respect to the micro-lens, and thus light emitted from the active region may be better collimated and collected by the display optics of a near-eye display. Because the active layers are not etched, they may have lower defect densities at the sidewalls such that non-radiative recombination at the sidewalls of the active regions may be reduced and thus the efficiencies of the micro-LEDs may be improved, even though the active regions may be small. In addition, when the size of the active region is reduced, the current density may increase with the same injection current. For micro-LEDs with small active regions (e.g., with widths below about 4 μm), increasing the current density may increase the IQEs and EQEs. Furthermore, since cavities with desired locations, sizes, and shapes can be relatively easily etched in the dielectric layer or the DBR layers, the active regions of the micro-LEDs regrown in the cavities can have the desired locations, sizes, and shapes defined by the cavities to counteract optical aberrations of the micro-lens, such that the emitted light may be better collimated by the micro-lenses and may be collected by the display optics at higher efficiencies.

Figure 13G:
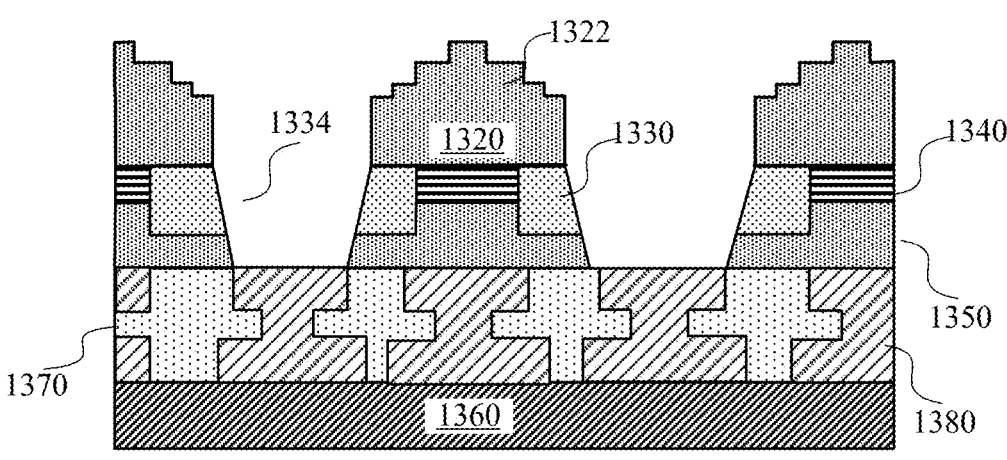

FIGS. 13A-13I illustrate an example of a process of fabricating a micro-LED device according to certain embodiments. FIG. 13A shows that a first doped semiconductor layer 1320 (e.g., n-doped GaN, AlInP, or AlGaInP layer) may be epitaxially grown on a substrate 1310 (e.g., a GaN substrate, a GaAs substrate, a silicon or a sapphire substrate with a buffer layer formed thereon). In some embodiments, first doped semiconductor layer 1320 may be a thick layer (e.g., >1 μm), such that native light extraction structures (e.g., micro-lenses) may be formed in first doped semiconductor layer 1320.

FIG. 13B shows that a dielectric layer 1330 may be deposited on first doped semiconductor layer 1320. Dielectric layer 1330 may include, for example, SiO₂ or SiN. Dielectric layer 1330 may have a thickness between about tens of nanometers to about one micron or thicker.

FIG. 13C shows that dielectric layer 1330 may be selectively etched to form a plurality of cavities 1332 in dielectric layer 1330. The locations, sizes, and shapes of cavities 1332 may be defined by an etch mask layer formed on dielectric layer 1330 through a photolithography process. For example, the width of each cavity 1332 may be less than about 1 μm, less than about 0.8 μm, less than about 0.6 μm, less than about 0.5 μm, or smaller. In some embodiments, the plurality of cavities 1332 may have a non-uniform pitch, non-uniform sizes, and/or non-uniform shapes.

FIG. 13D shows active layers 1340 epitaxially grown in cavities 1332 on exposed regions of first doped semiconductor layer 1320. As described above, active layers 1340 may include a plurality of quantum barrier layers and one or more quantum well layers. For example, active layers 1340 may include one or more InGaN quantum well layers and GaN barrier layers, or may include one or more GaInP quantum well layers and AlInP or AlGaInP quantum barrier layers. Because active layers 1340 are epitaxially grown on first doped semiconductor layer 1320 and are not etched, active layers 1340 may have low defect densities at the sidewall regions and thus may have high IQEs. A second doped semiconductor layer 1350 (e.g., p-doped GaN, AlInP, or AlGaInP) may be grown on active layers 1340 in cavities 1332, and may be further grown on dielectric layer 1330. Even though not shown in FIG. 13D, one or more contact layers, bonding layers, and/or back reflecting layers may be deposited on second doped semiconductor layer 1350, to form a micro-LED wafer.

FIG. 13E shows that the micro-LED wafer may be bonded to a backplane wafer to form a wafer stack as described above with respect to, for example, FIG. 11D. The backplane wafer may include a substrate 1360 (e.g., a silicon substrate) with LED drive circuits formed thereon, one or more dielectric layers 1370 (e.g., including SiO₂, SiN, or AlN), and one or more metal interconnect layers 1380 (e.g., including Cu, Al, Ti, and/or W) formed in dielectric layers 1370. As described above with respect to FIG. 11D, in some embodiments, the one or more metal interconnect layers 1380 may include a solid metal bonding layer for metal-to-metal bonding with the micro-LED wafer.

FIG. 13F shows that, after the bonding, substrate 1310 may be thinned or removed by, for example, etching, back grinding, or laser lifting, to expose first doped semiconductor layer 1320. The wafer stack may then be processed from the side of the exposed first doped semiconductor layer 1320, to form and mesa structures for individual micro-LEDS, and light extraction structures, such as micro-lenses.

FIG. 13G shows that first doped semiconductor layer 1320 may be etched in one or more etch processes to form step micro-lenses 1322. In each of the one or more etch processes, a sublayer of first doped semiconductor layer 1320 may be etched using an etch mask, where the etch mask may be formed by depositing a dielectric layer on first doped semiconductor layer 1320 and patterning the dielectric layer. In some embodiments, first doped semiconductor layer 1320 may be etched using a gray-scale lithographic process to form micro-lenses with continuous thickness profiles. After forming micro-lenses 1322 in first doped semiconductor layer 1320, the remaining first doped semiconductor layer 1320, dielectric layer 1330, and second doped semiconductor layer 1350 may be etched in regions 1334 to form individual mesa structures and to expose the bonding layer of the micro-LED wafer or the backplane wafer. Each mesa structure may include a portion of second doped semiconductor layer 1350, active layers 1340 surrounded by a portion of dielectric layer 1330, and a portion of first doped semiconductor layer 1320. A sublayer of second doped semiconductor layer 1350 may also be surrounded by dielectric layer 1330.

Figure 13H:
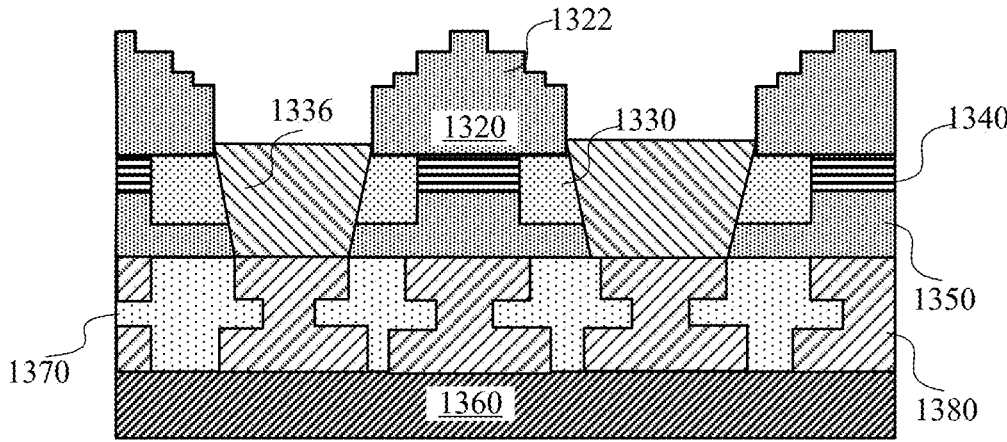

FIG. 13H shows that regions 1334 may be filled with filling materials 1336. In some embodiments, filling materials 1336 may include a metal, such as Al or Cu. In some embodiments, filling materials 1336 may include a dielectric material, such as $SiO_2$ or SiN. In some embodiments, filling materials 1336 may include a dielectric material layer (e.g., a passivation layer) on sidewalls of the mesa structure, and a metal filling the remaining regions of regions 1334. The metal may be used as sidewall reflectors. In some embodiments, the metal may be in contact with first doped semiconductor layer 1320, and may be used as electrical interconnects between the backplane wafer and second doped semiconductor layer 1320. In some embodiments, an antireflective coating layer may be formed on surfaces of the array of micro-lenses 1322.

Figure 13I:
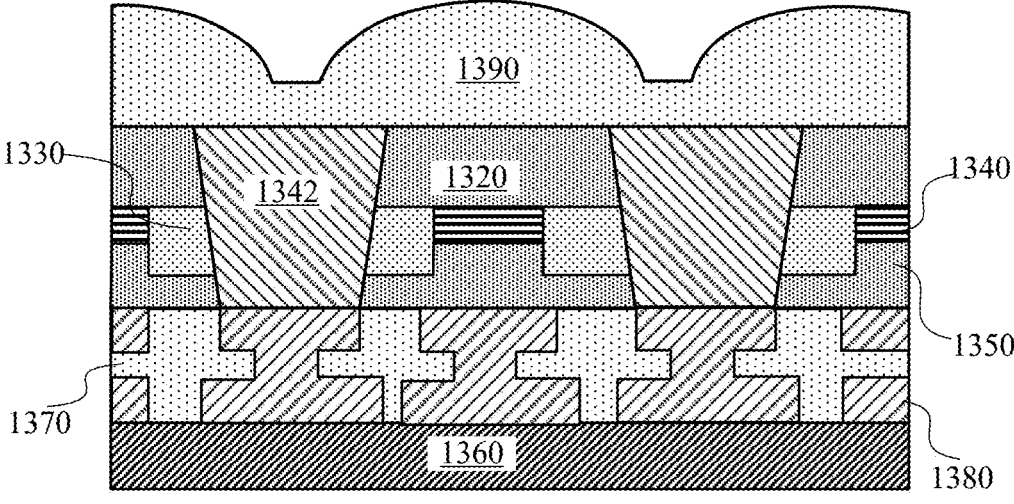

FIG. 13I shows that, instead of forming micro-lenses 1322 in first doped semiconductor layer 1320 as shown in FIGS. 13G and 13H, an array of micro-lenses 1390 may be formed on the layer stack in a lens material layer. For example, first doped semiconductor layer 1320, dielectric layer 1330, and second doped semiconductor layer 1350 may be etched to form mesa structures for individual micro-LEDs, and filling materials 1342 may be deposited into regions between the mesa structures. As filling material 1336, filling materials 1342 may include a metal, a dielectric material, or both a dielectric material and a metal. The array of micro-lenses 1390 may be formed in a substrate and then bonded to the layer stack, or may be formed in a lens material layer (e.g., a semiconductor layer or a dielectric layer such as a SiN layer) deposited on first doped semiconductor layer 1320. In some embodiments, an antireflective coating layer may be formed on surfaces of the array of micro-lenses 1390

Figures 14A, 14B:
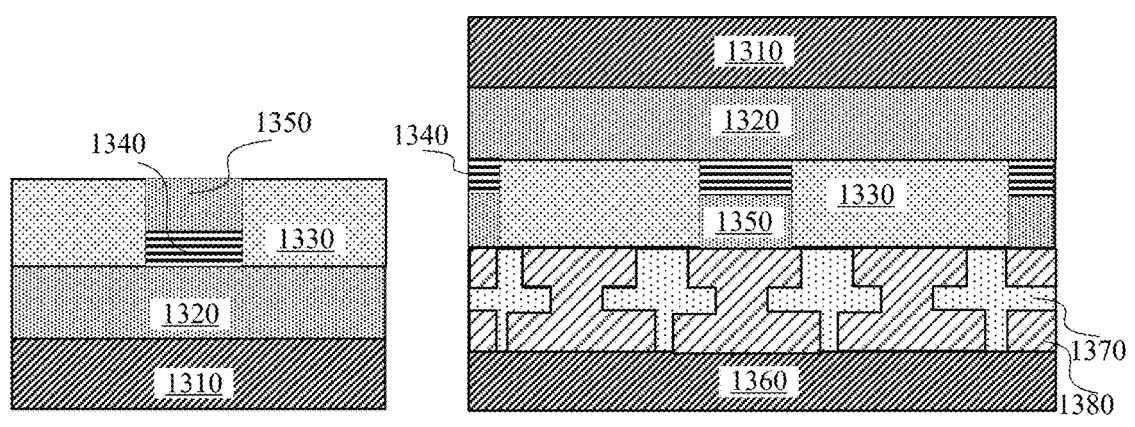
FIGS. 14A and 14B illustrate another example of a process of fabricating a micro-LED device according to certain embodiments.

FIGS. 14A and 14B illustrate another example of a process of fabricating a micro-LED device according to certain embodiments. The example shown in FIGS. 14A and 14B may be similar to the examples shown in FIGS. 13A-13I, except that second doped semiconductor layer 1350 may only be grown inside cavities 1332 formed in dielectric layer 1330, and thus may have the same lateral size as active layers 1340. Even though not shown in FIGS. 14A and 14B, processes as shown in FIGS. 13F-13I may be performed to form individual micro-LEDs and an array of micro-lenses on the micro-LEDs. Since both active layers 1340 and second doped semiconductor layer 1350 may be surrounded by dielectric layer 1330, no additional passivation layer may be needed at sidewalls of the mesa structures.

Figures 15A, 15B:
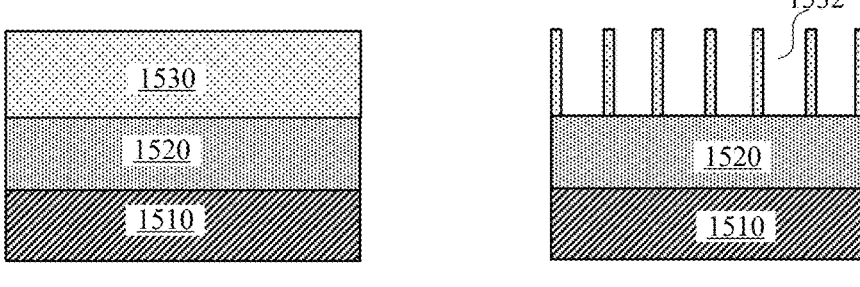
FIGS. 15A-15D illustrate yet another example of a process of fabricating a micro-LED device according to certain embodiments.

FIGS. 15A-15D illustrate yet another example of a process of fabricating a micro-LED device according to certain embodiments. FIG. 15A shows that a first doped semiconductor layer 1520 may be epitaxially grown on a substrate 1510 as described above with respect to FIG. 13A, and a dielectric layer 1530 may be deposited on first doped semiconductor layer 1520 as described above with respect to FIG. 13B.

FIG. 15B shows that dielectric layer 1530 may be etched to form a plurality of micro-cavities 1532. Each micro-cavity may have a width much less than a pitch of the micro-LEDs of the micro-LED device, such as between about 100 nm to about a few hundred nanometers. In some embodiments, a portion of first doped semiconductor layer 1520 may also be etched, such that micro-cavities 1532 may be formed in the portion of first doped semiconductor layer 1520 and dielectric layer 1530.

Figures 15C, 15D:
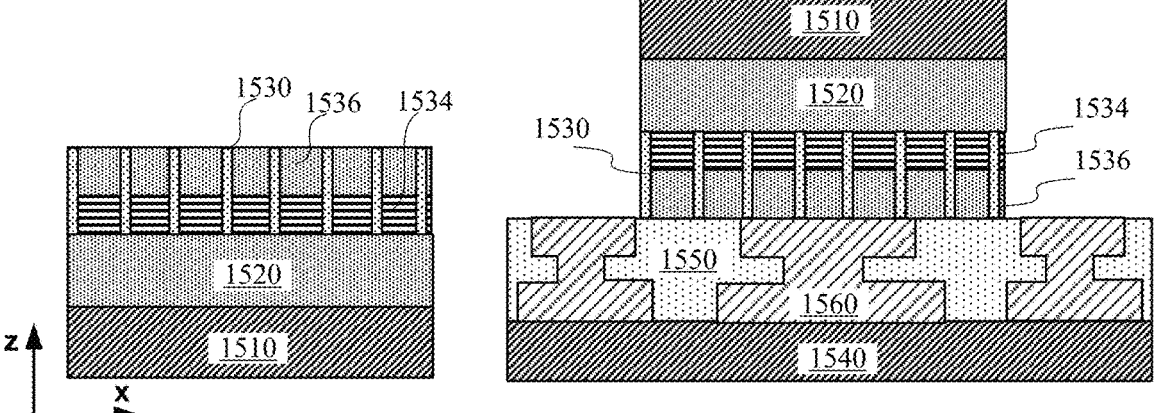

FIG. 15C shows that active layers 1534 may be regrown in micro-cavities 1532 on exposed regions of first doped semiconductor layer 1520. As described above, active layers 1534 may include a plurality of quantum barrier layers and one or more quantum well layers. For example, active layers 1534 may include one or more InGaN quantum well layers and GaN barrier layers, or may include one or more GaInP quantum well layers and two or more AlInP or AlGaInP quantum barrier layers. A second doped semiconductor layer 1536 (e.g., p-doped GaN, AlInP, or AlGaInP) may be grown on active layers 1534 in micro-cavities 1532. Even though not shown in FIG. 15C, one or more contact layers, bonding layers, and/or back reflecting layers may be deposited on top of second doped semiconductor layer 1536 and/or dielectric layer 1530, to form a micro-LED wafer.

FIG. 15D shows that the micro-LED wafer may be bonded to a backplane wafer to form a wafer stack as described above with respect to, for example, FIG. 13E. The backplane wafer may include a substrate 1540 (e.g., a silicon substrate) with LED drive circuits formed thereon, one or more dielectric layers 1550 (e.g., including $SiO_2$, SiN, or AlN), and one or more metal interconnect layers 1560 (e.g., including Cu, Al, Ti, and/or W) formed in dielectric layers 1550. As described above with respect to FIG. 11D, in some embodiments, the one or more metal interconnect layers 1560 may include a solid metal bonding layer for metal-to-metal bonding with the micro-LED wafer. The bonded wafer stack may be processed as described above with respect to FIGS. 13F-13I to form individual micro-LEDs, sidewall reflectors, and light extraction structures (e.g., micro-lenses).

Figure 16A:
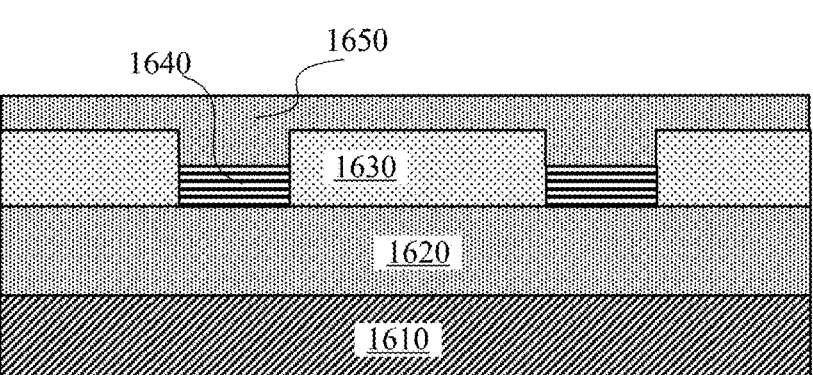
FIGS. 16A-16C illustrate another example of a process of fabricating a micro-LED device according to certain embodiments.
Figure 16B:
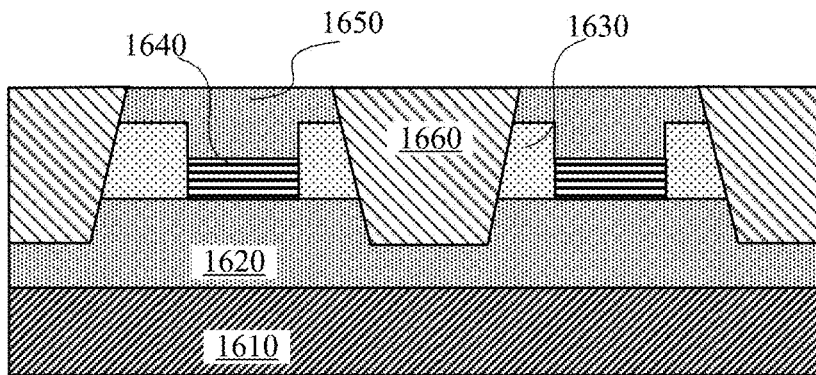
Figure 16C:
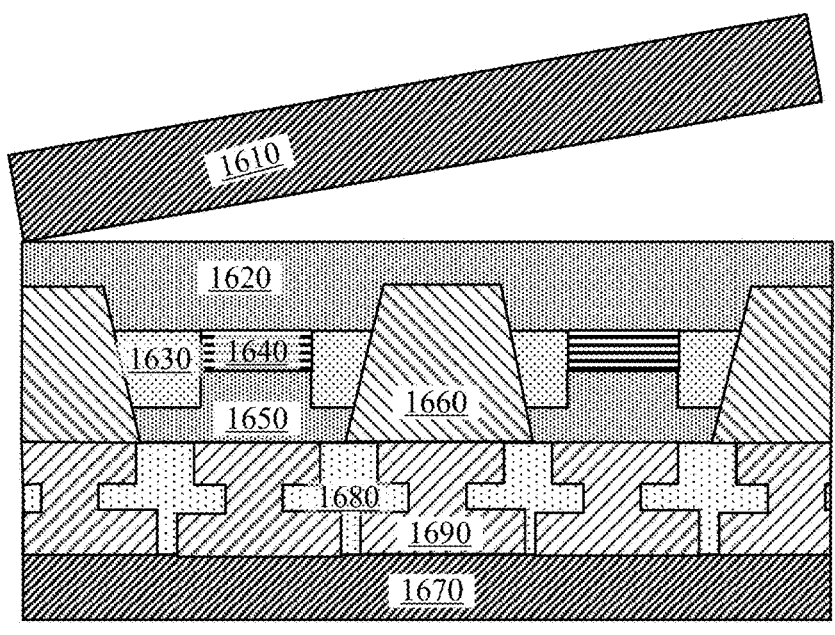

FIGS. 16A-16C illustrate yet another example of a process of fabricating a micro-LED device according to certain embodiments. FIG. 16A shows a micro-LED wafer including a substrate 1610, a first doped (e.g., n-doped) semiconductor layer 1620, a patterned dielectric layer 1630, active layers 1640 regrown on exposed portions of first doped semiconductor layer 1620 through cavities formed in dielectric layer 1630, and a second doped (e.g., p-doped) semiconductor layer 1650, as described above with respect to, for example, FIGS. 13A-13D. Substrate 1610 may include, for example, a GaN substrate, a GaAs substrate, or a sapphire substrate with a buffer layer formed thereon. First doped semiconductor layer 1620 may include, for example, n-doped GaN, AlInP, or AlGaInP layer, and may be epitaxially grown on substrate 1610. Dielectric layer 1630 may include, for example, SiO$_2$ or SiN, and may have a thickness between about tens of nanometers to about one micron or thicker. The locations, sizes, and shapes of the cavities in dielectric layer 1630 may be defined by an etch mask layer formed on dielectric layer 1630 through a photolithography process. For example, the width of each cavity may be less than about 1 μm, less than about 0.8 μm, less than about 0.6 μm, less than about 0.5 μm, or smaller. In some embodiments, the width of each cavity may be less than about 25% of a pitch of the micro-LEDs to be fabricated, or may be less than about 75% of the mesa structure for each micro-LED. In some embodiments, the cavities may be micro-cavities as shown in FIG. 15B. In some embodiments, the cavities may have a non-uniform pitch, non-uniform sizes, and/or non-uniform shapes.

Active layers 1640 may be epitaxially grown in the cavities, and may include a plurality of quantum barrier layers and one or more quantum well layers. For example, active layers 1640 may include one or more InGaN quantum well layers and GaN barrier layers, or may include one or more GaInP quantum well layers and two or more AlInP or AlGaInP quantum barrier layers. Second doped semiconductor layer 1650 may include, for example, p-doped GaN, AlInP, or AlGaInP. Second doped semiconductor layer 1650 may be grown on active layers 1640 and inside the cavities, and may be further grown on patterned dielectric layer 1630. In some embodiments, second doped semiconductor layer 1650 may only be grown inside the cavities in patterned dielectric layer 1630 as shown in FIGS. 14A and 14B. In some embodiments, active layers 1640 and second doped semiconductor layer 1650 may be grown in micro-cavities as shown in FIG. 15C.

FIG. 16B shows that the micro-LED wafer may be processed from the side of second doped semiconductor layer 1650, where regions of second doped semiconductor layer 1650, dielectric layer 1630, and first doped semiconductor layer 1620 may be selectively etched to form mesa structures. Each mesa structure may include a portion of first doped semiconductor layer 1620, active layers 1640 surrounded by dielectric layer 1630, and a portion of second doped semiconductor layer 1650. At least a portion of first doped semiconductor layer 1620 may not be etched. Regions between the mesa structures may be filled with filling materials 1660. Filling materials 1660 may include a dielectric material (e.g., SiO$_2$ or SiN) layer on sidewalls of the mesa structures to isolate the micro-LEDs (e.g., isolating the second doped semiconductor layers 1650 of adjacent mesa structures), and may also include a metal (e.g., Al or Cu) filling the remaining regions between the mesa structures. The metal may be used as sidewall reflectors and electrical interconnects for first doped semiconductor layer 1620. Even though not shown in FIG. 16B, one or more contact layers, bonding layers, and/or back reflecting layers may be formed on second doped semiconductor layer 1650, as shown in, for example, FIG. 12C.

FIG. 16C shows that the micro-LED wafer may be bonded to a backplane wafer as described above with respect to FIG. 12D. The backplane wafer may include a substrate 1670 (e.g., a silicon substrate), one or more dielectric layers 1680 (e.g., including SiO$_2$, SiN, or AlN), and one or more metal interconnect layers 1690 (e.g., including Cu, Al, Ti, and/or W) formed in dielectric layers 1680. The bonded wafer stack may be processed from the side of substrate 1610, as described above with respect to, for example, 12E, where substrate 1610 may be thinned or removed, micro-lenses may be formed in first doped semiconductor layer 1620 or a dielectric layer deposited on first doped semiconductor layer 1620 as shown in FIGS. 13F-13I, or may be bonded to first doped semiconductor layer 1620. The micro-lenses may be stepped micro-lenses or may have continuous thickness profiles as described above, for example with respect to FIGS. 13G-13I.

When the emission angles of the micro-LEDs in the micro-LED device are about the same, light emitted by the micro-LEDs may not be uniformly collected and delivered to the eyebox of a near-eye display system by the display optics (e.g., an image projecting lens) that may have a limited aperture size and a limited field of view. For example, light emitted by micro-LEDs near edges of the micro-LED device may be collected and delivered to the eyebox of the display system at lower efficiencies than light emitted by micro-LEDs at the center of the micro-LED device, which may cause non-uniform intensity or brightness in the displayed images and low overall efficiency of the near-eye display system. Therefore, light emitted from micro-LEDs at the edges of the micro-LED device may need to be directed differently than light emitted from micro-LEDs near the center of the micro-LED device. One technique to redirect the emitted light is using a micro-lens array that includes decentered micro-lenses for some micro-LEDs. For example, the micro-lens array may have a pitch different from the pitch of the array of light emitting devices or may otherwise be center-offset with respect to the array of light emitting devices, such that the light beam emitted by each light emitting device may not only be collimated or focused, but may also be deflected by a respective angle towards the display optics. This technique may need a precise pixel-level alignment (and thus may be difficult to manufacture), and may have limited deflection angle due to certain geometry limitations. For example, to deflect an emitted light beam by a large angle, the center of the micro-lens in the micro-lens array may need to be offset from the center of the corresponding light emitting device in the array of light emitting devices by a large amount, which may cause crosstalk and/or opposite deflecting due to the small sizes and pitches of the array of light emitting devices and the micro-lens array.

According to certain embodiments disclosed herein, the locations, sizes, and/or shapes of individual light-emitting regions of the micro-LEDs may be defined by the cavities formed in the dielectric layers, where the cavities may have non-uniform pitches, non-uniform sizes, and/or non-uniform shapes, even though the micro-LED mesa structures may have uniform pitches, sizes, and shapes. In this way, even if the micro-lenses have a uniform pitch, light emitted by different micro-LEDs may be deflected differently by the micro-lenses due to the different offsets between the light-emitting regions and the micro-lenses, thereby improving the in-coupling efficiency of display light from the micro-LEDs into a near-eye display system. In addition, the shapes and sizes of the light-emitting regions may be selected to counteract optical aberrations of the micro-lenses for off-axis light.

Figures 17A, 17B, 17C, 17D, 17E:
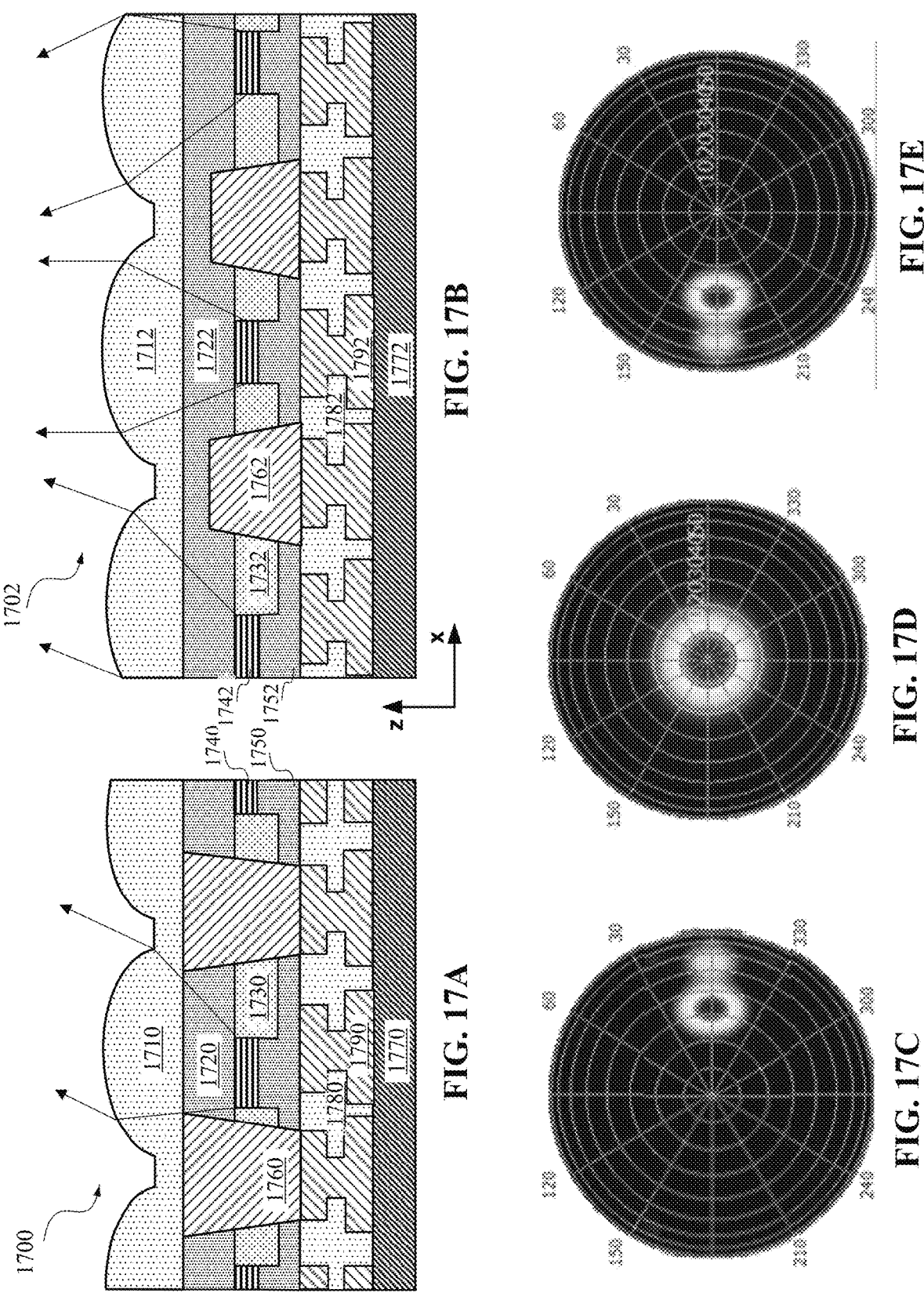
FIG. 17A illustrates an example of a micro-LED device including off-centered micro-LED light-emitting regions in micro-LED mesa structures according to certain embodiments.
FIG. 17B illustrates another example of a micro-LED device with off-centered light-emitting regions in micro-LED mesa structures according to certain embodiments.
FIGS. 17C-17E illustrate examples of beam steering in micro-LED device 1702 by varying locations of the light emitting regions of the micro-LEDs according to certain embodiments.

FIG. 17A illustrates an example of a micro-LED device 1700 including off-centered micro-LED light-emitting regions in micro-LED mesa structures according to certain embodiments. Micro-LED device 1700 may be fabricated using processes described above with respect to, for example, FIGS. 13A-13I. In the illustrated example, micro-LED device 1700 may include a backplane wafer that includes a substrate 1770 with micro-LED drive circuits form thereon, one or more dielectric layers 1780 deposited on substrate 1770, and one or more electrical interconnect layers 1790 in dielectric layers 1780. The backplane wafer may be bonded to a micro-LED wafer to form a wafer stack.

The micro-LED wafer may include a first doped semiconductor layer 1720, a plurality of active regions 1740 grown on first doped semiconductor layer 1720 and in cavities etched in a dielectric layer 1730, and a second doped semiconductor layer 1750 grown on active regions 1740 and dielectric layer 1730. The cavities etched in dielectric layer 1730 may have non-uniform pitches, sizes, and/or shapes. A width of each cavity may be less than about 25% of a pitch of the cavities, or less than about 75% of a width of the mesa structure for a micro-LED.

The wafer stack may be processed from the side of the micro-LED wafer to remove the substrate of the micro-LED wafer, etch first doped semiconductor layer 1720, dielectric layer 1730, and second doped semiconductor layer 1750 to form mesa structures for individual micro-LEDs, fill gaps between the mesa structures with filling materials 1760 (e.g., including a metal and/or a dielectric material), and form an array of micro-lenses 1710 on first doped semiconductor layer 1720. Even though not shown in FIG. 17A, in some embodiments, a transparent conductive layer (e.g., ITO layer) may be formed on first doped semiconductor layer 1720, before forming the array of micro-lenses 1710. In some embodiments, an antireflective coating layer may be formed on surfaces of the array of micro-lenses 1710.

In the example illustrated in FIG. 17A, the array of micro-lenses 1710 may have a uniform pitch, and the mesa structures of the micro-LEDs may have the same uniform pitch. The sizes of the mesa structures may be uniform or non-uniform. However, the active regions 1740 may have non-uniform pitches, and may not be at the centers of the corresponding mesa structures. For example, FIG. 17A shows a micro-LED where active region 1740 is off-centered in the mesa structure and thus is off-axis with respect to the corresponding micro-lens 1710. As such, light emitted in active region 1740 of the micro-LED may be collimated and deflected with respect to the surface-normal (e.g., z) direction.

FIG. 17B illustrates another example of a micro-LED device 1702 with off-centered light-emitting regions in micro-LED mesa structures according to certain embodiments. Micro-LED device 1702 may be fabricated using fabrication processes described above with respect to, for example, FIGS. 16A-16C. In the illustrated example, micro-LED device 1702 may include a backplane wafer that includes a substrate 1772 with micro-LED drive circuits form thereon, one or more dielectric layers 1782 deposited on substrate 1772, and one or more electrical interconnect layers 1792 formed in dielectric layers 1782. The backplane wafer may be bonded to a micro-LED wafer to form a wafer stack.

The micro-LED wafer may include a first doped semiconductor layer 1722, a plurality of active regions 1742 grown on first doped semiconductor layer 1722 and in cavities etched in a dielectric layer 1732, and a second doped semiconductor layer 1752 grown on active regions 1742 and dielectric layer 1732. The cavities etched in dielectric layer 1732 may have non-uniform pitches, sizes, and/or shapes. A width of each cavity may be less than about 25% of a pitch of the cavities, or less than about 75% of a width of the mesa structure for a micro-LED. Second doped semiconductor layer 1752, dielectric layer 1732, and a portion of first doped semiconductor layer 1722 may be etched to form mesa structures for individual micro-LEDs. Gaps between the mesa structures may be filled with filling materials 1762 (e.g., including a metal and/or a dielectric material). The micro-LED wafer may also include one or more bonding layers and/or a back reflector layer. After the bonding, the substrate of the micro-LED wafer may be removed to expose first doped semiconductor layer 1722, and an array of micro-lenses 1712 may be formed in or on first doped semiconductor layer 1722 as described above. Even though not shown in FIG. 17B, in some embodiments, a transparent conduction layer (e.g., ITO layer) may be formed on first doped semiconductor layer 1722, before forming the array of micro-lenses 1712. In some embodiments, an antireflective coating layer may be formed on surfaces of the array of micro-lenses 1712.

In the example illustrated in FIG. 17B, the array of micro-lenses 1712 may have a uniform pitch, and the mesa structures of the micro-LEDs may have the same uniform pitch. The sizes of the mesa structures may be uniform or non-uniform. However, the active regions 1742 may have non-uniform pitches, and may not be at the centers of the corresponding mesa structures. For example, FIG. 17B shows a first micro-LED (e.g., the middle micro-LED) where active region 1742 of the first micro-LED is at the center of the mesa structure and thus is on axis of the corresponding micro-lens 1712. Therefore, light emitted in active region 1742 of the first micro-LED may be collimated and emitted in the surface-normal (e.g., z) direction. FIG. 17B also shows a second micro-LED (e.g., the left micro-LED) where active region 1742 of the second micro-LED is off-centered (on the left side) in the mesa structure and thus is off-axis with respect to the corresponding micro-lens 1712. Therefore, light emitted in active region 1742 of the second micro-LED may be collimated and may be deflected with respect to the surface-normal (e.g., z) direction towards the center of micro-LED device 1702. FIG. 17B further shows a third micro-LED (e.g., the right micro-LED) where active region 1742 is off-centered (on the right side) in the mesa structure and thus is off-axis with respect to the corresponding micro-lens 1712. Therefore, light emitted in active region 1742 of the micro-LED may be collimated and may be deflected with respect to the surface-normal (e.g., z) direction towards the center of micro-LED device 1702.

FIGS. 17C-17E illustrate examples of beam steering in micro-LED device 1702 by varying locations of the light emitting regions of the micro-LEDs according to certain embodiments. For example, FIG. 17C shows the light beam extracted from the second micro-LED of micro-LED device 1702 by the corresponding micro-lens 1712, where the active region 1742 of the second micro-LED is off-centered (on the left side) in the mesa structure, and thus is misaligned with the corresponding micro-lens 1712, such that the light emitted in active region 1742 of the second micro-LED may be collimated and deflected with respect to the surface-normal (e.g., z) direction towards the center of micro-LED device 1702 by the corresponding micro-lens 1712. Due to optical aberrations of micro-lens 1712 for off-axis light, the output light beam may not be fully collimated and may not have a circular beam intensity profile as shown in FIG. 17C.

FIG. 17D shows the light beam extracted from the first micro-LED of micro-LED device 1702 by the corresponding micro-lens 1712, where the active region 1742 of the first micro-LED is at the center of the mesa structure, and thus is aligned with the corresponding micro-lens 1712, such that the light emitted in active region 1742 of the first micro-LED may be collimated by the corresponding micro-lens 1712 and emitted into the surface-normal (e.g., z) direction. As shown in FIG. 17D, the output light beam may have a circular beam intensity profile.

FIG. 17E shows the light beam extracted from the third micro-LED of micro-LED device 1702 by the corresponding micro-lens 1712, where the active region 1742 of the third micro-LED is off-centered (on the right side) in the mesa structure, and thus is misaligned with the corresponding micro-lens 1712, such that the light emitted in active region 1742 of the third micro-LED may be collimated and deflected with respect to the surface-normal (e.g., z) direction towards the center of micro-LED device 1702 by the corresponding micro-lens 1712. Due to optical aberrations of micro-lens 1712 for off-axis light, the output light beam may not be fully collimated and may not have a circular beam intensity profile as shown in FIG. 17E.

Figure 18A:
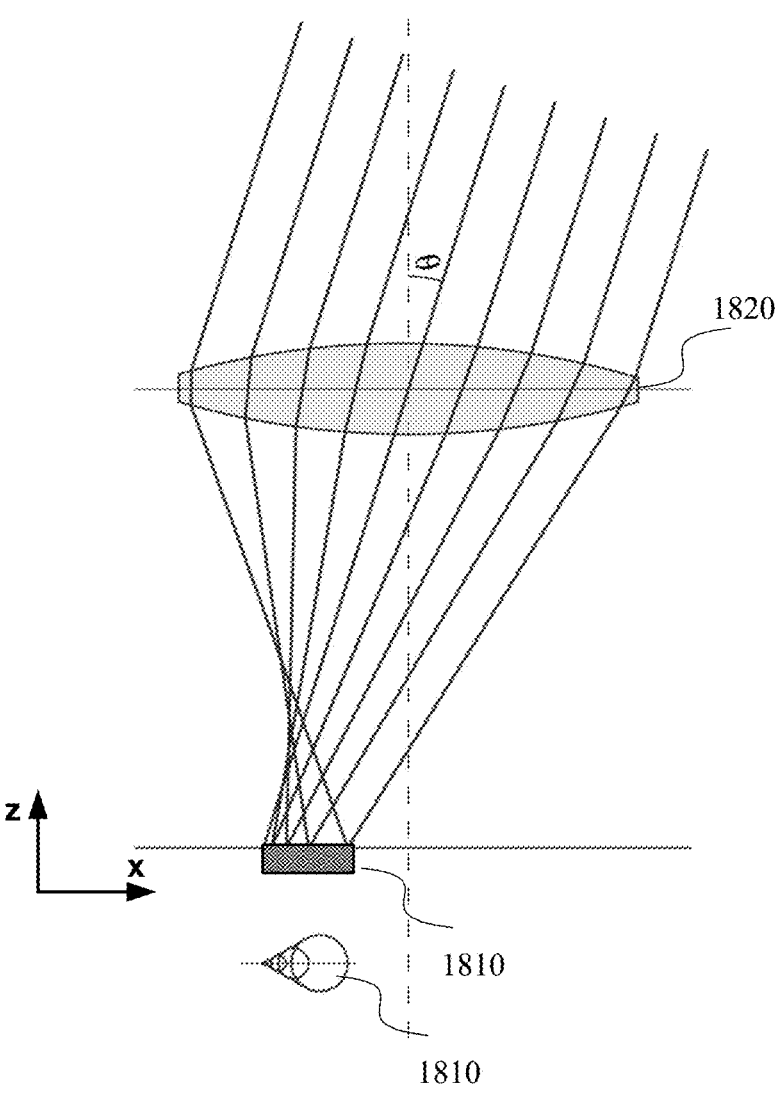
FIGS. 18A and 18B illustrate examples of controlling the locations, shapes, and sizes of the active regions of micro-LEDs to counteract the optical aberrations of micro-lenses for collimating off-axis light emitted by the micro-LEDs according to certain embodiments.
Figure 18B:

FIGS. 18A and 18B illustrate examples of controlling the locations, shapes, and sizes of the active regions of micro-LEDs to counteract the optical aberrations of micro-lenses for collimating off-axis light emitted by the micro-LEDs according to certain embodiments. As shown in FIG. 18A, to achieve a uniform collimated beam that has a circular beam intensity profile and propagates at an angle θ with respect to the z direction, the active region 1810 of a micro-LED that is not center-aligned with a corresponding micro-lens 1820 may need to have a non-circular shape. FIG. 18B shows that the active regions of the micro-LEDs at different locations of the micro-LED device may need to have different shapes, sizes, and locations in the corresponding mesa structures.

Figures 19A, 19B, 19C, 19D:
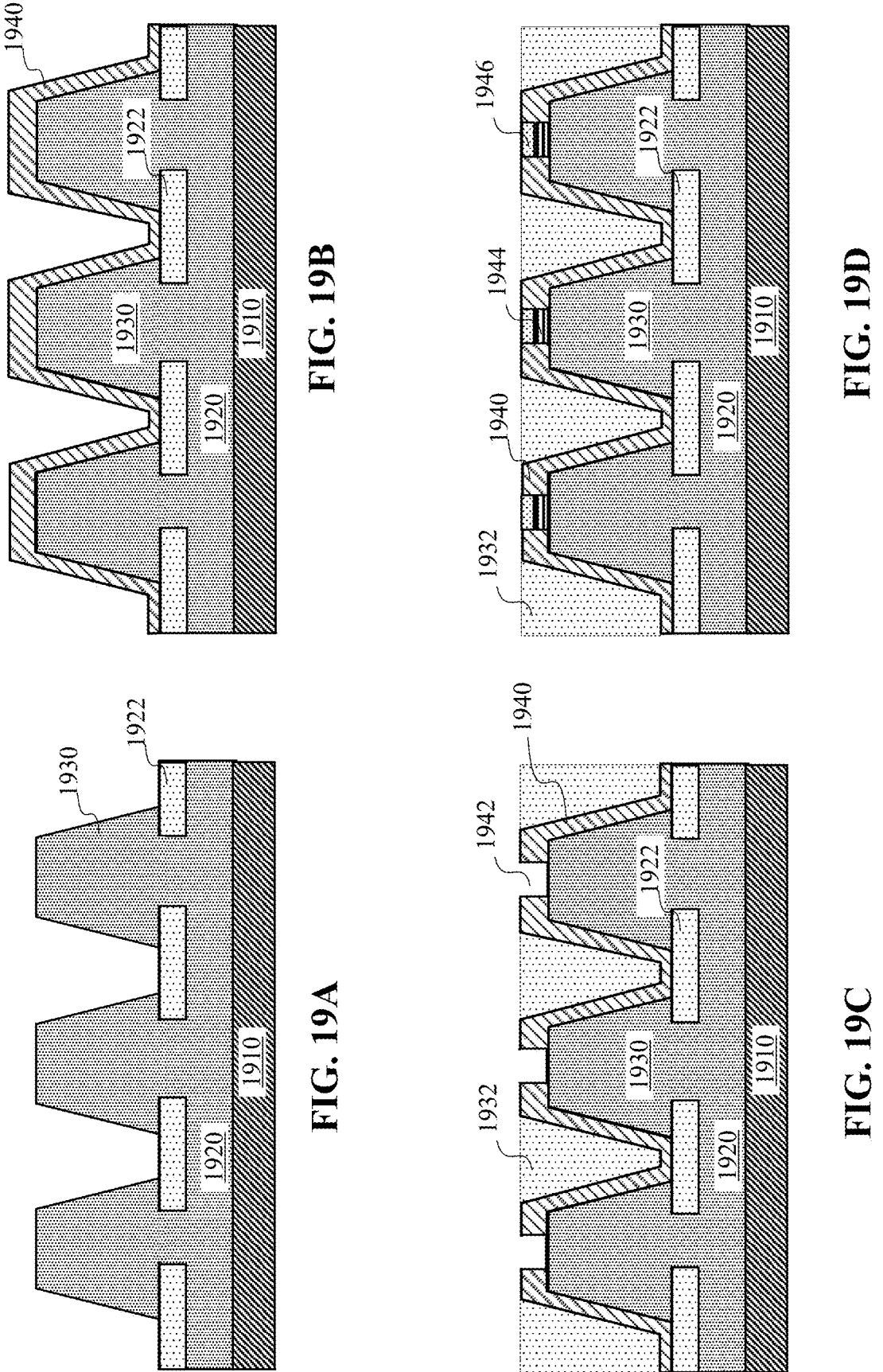
FIGS. 19A-19G illustrate an example of a process of fabricating a micro-LED device with active regions grown in cavities formed in distributed Bragg reflector (DBR) layers according to certain embodiments.

FIGS. 19A-19G illustrate an example of a process of fabricating a micro-LED device with active regions grown in cavities formed in DBR layers according to certain embodiments. FIG. 19A shows a semiconductor layer 1920 (e.g., a growth substrate layer) grown on a substrate 1910, and semiconductor structures 1930 overgrown on semiconductor layer 1920 through an overgrowth mask layer 1922 formed on semiconductor layer 1920. Substrate 1910 may include, for example, a GaN substrate or a sapphire substrate with a buffer layer formed thereon. Semiconductor layer 1920 may include, for example, GaN, AlInP, or AlGaInP, and may be doped (e.g., n-doped) or undoped. Overgrowth mask layer 1922 may be a patterned dielectric layer (e.g., Sin or $SiO_2$ layer) that includes an array of apertures (e.g., a two-dimensional array of apertures). To form small semiconductor structures, such as truncated pyramid-shaped structures with a small horizontal linear dimension (e.g., with a width about or less than 1 μm), the apertures in overgrowth mask layer 1922 may have a polygonal or a circular shape with a diameter about or less than, for example, 500 nm, 200 nm, or 100 nm. To form larger semiconductor structures, such as truncated pyramid structures with a horizontal linear dimension about or greater than 1 μm, the apertures in overgrowth mask layer 1922 may have a polygonal (e.g., hexagonal) shape. In some embodiments, each sidewall of a polygonal-shaped aperture may align with an m-plane of semiconductor layer 1920. Semiconductor structures 1930 may be epitaxially grown on semiconductor layer 1920 using suitable techniques such as the MBE or MOCVD process, and may include, for example, n-doped GaN, AlInP, or AlGaInP. The epitaxial growth may first occur through the apertures, and may then extend laterally. When the apertures in overgrowth mask layer 1922 have the size, shape, and sidewall orientation described above, the epitaxial growth on an exposed region of semiconductor layer 1920 through an aperture may naturally form a truncated pyramid-shaped semiconductor structure 1930 due to the preferential growth planes of the overgrowth process. The sidewalls of each truncated pyramid may align with a semipolar plane, such as the $(11\bar{2}2)$ s2-plane or the $(10\bar{1}1)$ s5-plane.

FIG. 19B shows that DBR layers 1940 may be deposited on surfaces of semiconductor structures 1930. In some embodiments, DBR layers 1940 may include interleaved layers of two dielectric materials having different refractive indices such that the reflected light at the interfaces between adjacent layers of different materials may constructively interfere to enhance the reflection. DBR layers 1940 may be conformally formed on surfaces of semiconductor structures 1930 using, for example, atomic layer deposition, or other conformal deposition techniques. DBR layers 1940 may be used as the sidewall reflectors to improve the LEEs of the micro-LEDs.

FIG. 19C shows that regions of DBR layers 1940 on top of semiconductor structures 1930 may be etched to form cavities 1942 in DBR layers 1940 and expose portions of semiconductor structures 1930. Cavities 1942 may be etched in DBR layers 1940 by, for example, filling gaps between semiconductor structures 1930 with a dielectric layer 1932, forming a patterned etch mask layer on DBR layers 1940 on top of semiconductor structures 1930, and etching DBR layers 1940 through the etch mask layer. As described above, cavities 1942 may or may not be at the center of semiconductor structures 1930, and may have different sizes and/or shapes.

In some embodiments, DBR layers 1940 may include interleaved layers of AlN and GaN. In such embodiments, after forming cavities 1942 in DBR layers 1940, a dielectric layer may be deposited to fill cavities 1942 and cover DBR layers 1940. Portions of the dielectric layer filing cavities 1942 may be etched to from new cavities in the dielectric layer, such that inner sidewalls of cavities 1942 may be covered with the dielectric layer, which may electrically isolate the GaN layers in the DBR layers from epitaxial layers to be grown in the cavities.

FIG. 19D shows active layers 1944 epitaxially grown in cavities 1942 on exposed regions of semiconductor structures 1930. As described above, active layers 1944 may include a plurality of quantum barrier layers and one or more quantum well layers. For example, active layers 1944 may include one or more InGaN quantum well layers and GaN barrier layers, or may include one or more GaInP quantum well layers and two or more AlInP or AlGaInP quantum barrier layers. Because active layers 1944 are epitaxially grown on semiconductor structures 1930 and are not etched, active layers 1944 may have low defect densities at the sidewall regions and thus may have high IQEs. A second doped semiconductor layer 1946 (e.g., p-doped GaN, AlInP, or AlGaInP) may be grown on active layers 1944 in cavities 1942. Even though not shown in FIG. 19D, one or more contact layers, bonding layers, and/or back reflecting layers may be formed on second doped semiconductor layer 1946, as shown in, for example, FIG. 12C.

Figure 19E:
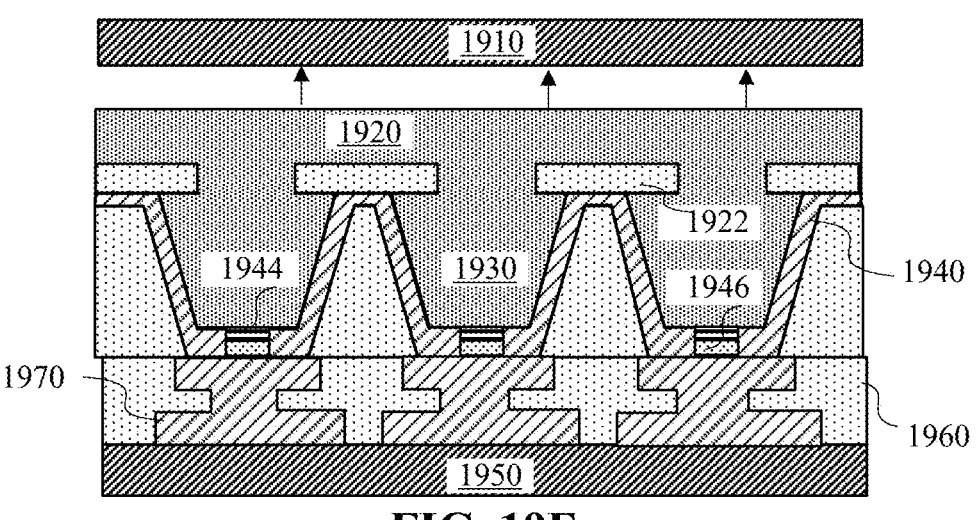

FIG. 19E shows that the micro-LED wafer may be bonded to a backplane wafer as described above with respect to, for example, FIG. 8C, FIG. 12D, or FIG. 13E. The backplane wafer may include a substrate 1950 (e.g., a silicon substrate) with CMOS drive circuits formed thereon, one or more dielectric layers 1960 (e.g., including $SiO_2$, SiN, or AlN), and one or more metal interconnect layers 1970 (e.g., including Cu, Al, Ti, and/or W) formed in dielectric layers 1960. The bonded wafer stack may be processed from the side of substrate 1910, where substrate 1910 may be thinned or removed, and light extraction structures (e.g., micro-lenses) may be formed in or on semiconductor layer 1920. In some embodiments, at least a sublayer of semiconductor layer 1920 may be removed.

Figure 19F:
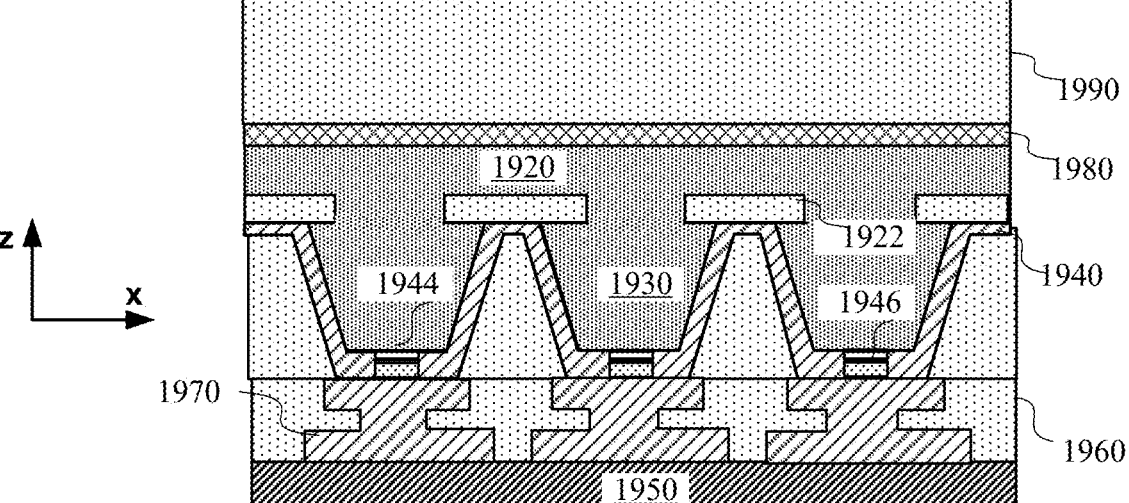

FIG. 19F shows that a transparent conductive layer 1980 (e.g., an ITO layer) may be deposited on semiconductor layer 1920. Transparent conductive layer 1980 may be used as an electrode (e.g., a common cathode). A dielectric layer 1990 (e.g., including $SiO_2$ or SiN)) may be deposited on transparent conductive layer 1980.

Figure 19G:
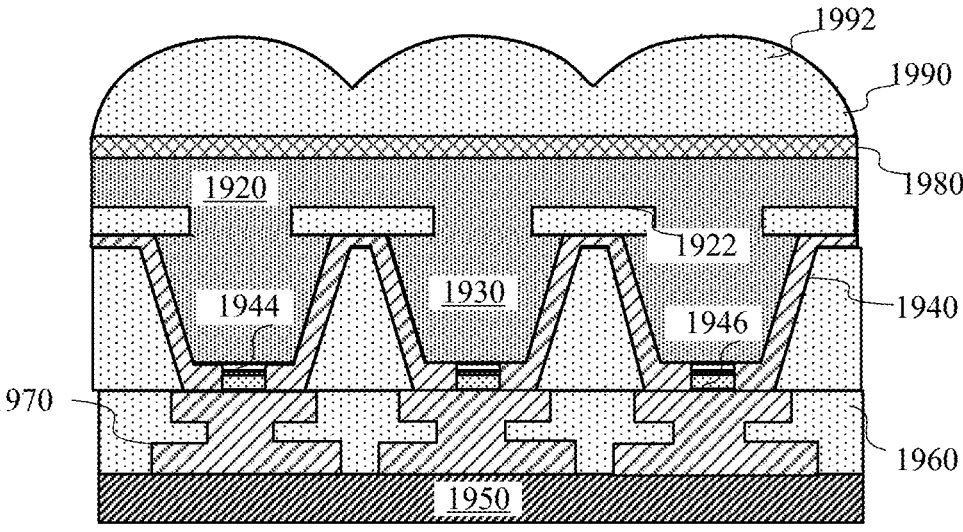

FIG. 19G shows that micro-lenses 1992 may be formed in dielectric layer 1990. Micro-lenses 1992 may be stepped micro-lenses or may have continuous thickness profiles as described above, for example with respect to FIGS. 13G-13I. Micro-lenses 1992 may be used to collimate and/or deflect light beams emitted by active layers 1944. In some embodiments, an antireflective coating layer may be formed on surfaces of micro-lenses 1992. Light emitted in active layers 1944 may be reflected by the back reflector and DBR layers 1940 towards micro-lenses 1992, which may collimate and redirect the light as described above.

Figure 20A:
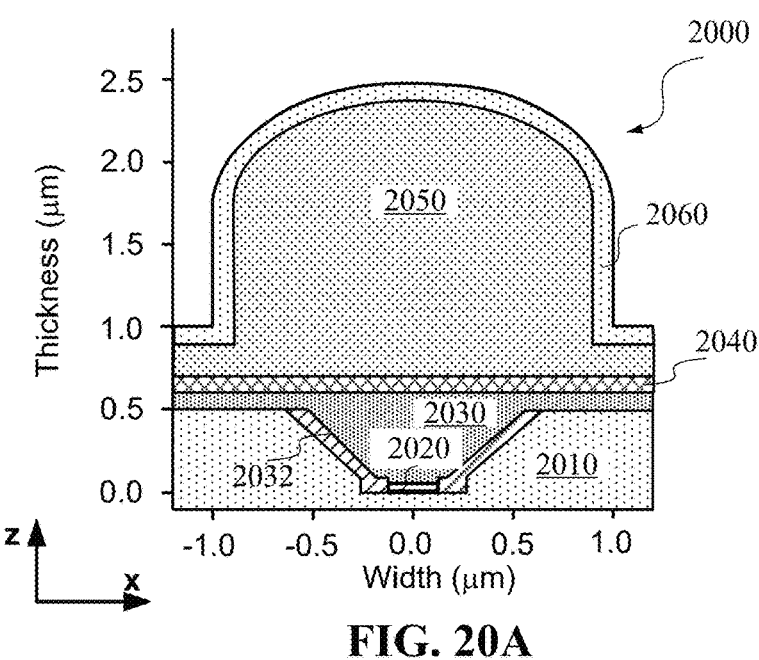
FIG. 20A illustrates an example of a micro-LED with the active regions grown in a cavity formed in DBR layers according to certain embodiments.

FIG. 20A illustrates an example of a micro-LED 2000 with an active region 2020 grown in a cavity formed in DBR layers 2032 according to certain embodiments. Micro-LED 2000 may be fabricated using processes described above with respect to, for example, FIGS. 19A-19G. In the illustrated example, micro-LED 2000 may include a dielectric material 2010, active region 2020 formed in a cavity in DBR layers 2032, a semiconductor layer 2030 (e.g., an n-doped GaN layer), an ITO layer 2040, a micro-lens 2050 on ITO layer 2040, and an antireflective coating layer 2060 on the surface of micro-lens 2050. The width or pitch of micro-LED 2000 may be about 2 μm, the width of micro-lens 2050 may be about 2 μm, the width of the mesa structure of micro-LED 2000 may be about 1 μm or smaller, and the width of active region 2020 may be about 250 nm. Micro-LED 2000 may emit blue light at about 450 nm.

Figure 20B:
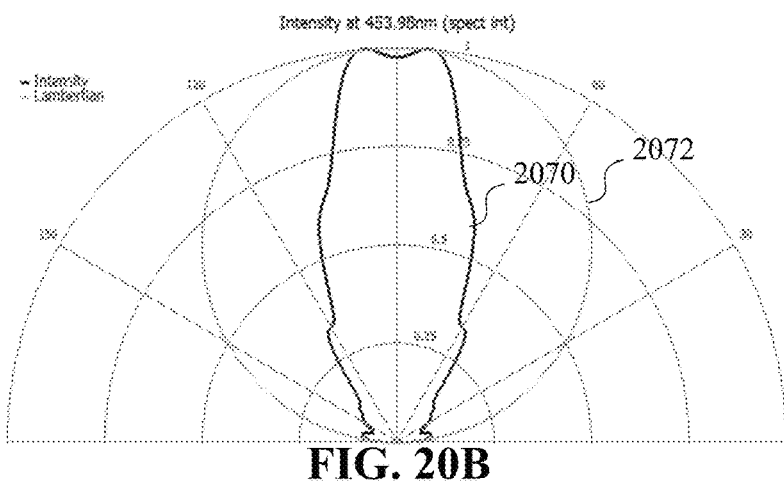
FIGS. 20B and 20C illustrate simulation results of the micro-LED of FIG. 20A.
Figure 20C:
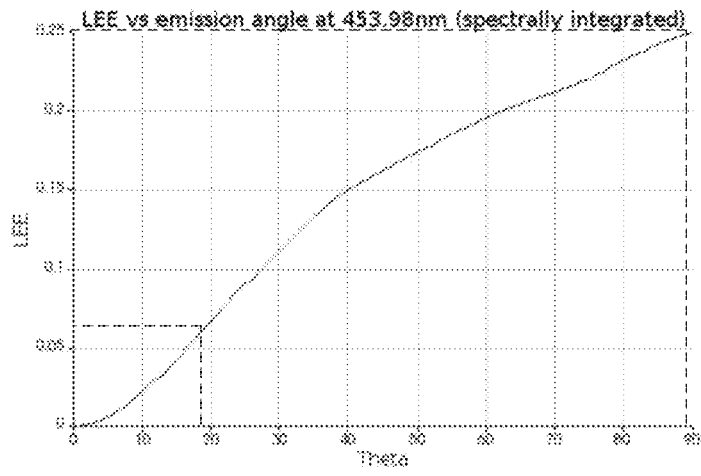

FIGS. 20B and 20C show simulation results of micro-LED 2000 of FIG. 20A. FIG. 20B shows an output beam intensity profile 2070 of micro-LED 2000, as compared against a Lambertian beam intensity profile 2072. FIG. 20C shows the collected light extraction efficiency within different view angle ranges. The total LEE of micro-LED 2000 (within ±90°) may be about 25%, and the collected LEE of micro-LED 2000 for light within ±18.5° may be about 6%.

FIG. 21 includes a flowchart 2100 illustrating an example of a process of fabricating a micro-LED device according to certain embodiments. It is noted that the operations illustrated in FIG. 21 provide particular processes for fabricating micro-LED devices. Other sequences of operations can also be performed according to alternative embodiments. For example, alternative embodiments may perform the operations in a different order. Moreover, the individual operations illustrated in FIG. 21 can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

Operations in block 2110 may include growing a first doped semiconductor layer on a growth substrate layer, as described above with respect to, for example, FIG. 13A or 19A. The growth substrate layer may include, for example, a GaN substrate or a sapphire substrate with a doped or undoped buffer layer formed thereon. The growth substrate layer may be undoped or may include a doped (e.g., n-doped) semiconductor layer. The first doped semiconductor layer may include, for example, n-doped GaN, AlInP, or AlGaInP. In some embodiments as shown in FIG. 13A, the first doped semiconductor layer may include a planar layer.

In some embodiments as shown in FIG. 19A, an overgrowth mask layer (e.g., SiN or $SiO_2$ layer) may be deposited on the growth substrate layer, the overgrowth mask layer may be patterned to form an array of apertures (e.g., a two-dimensional array of apertures) in the overgrowth mask layer, and the first doped semiconductor layer may be grown on the growth substrate layer through the array of apertures and may include an array of semiconductor structures (e.g., truncated pyramid-shaped semiconductor structures). The pitch of the array of apertures may be less than 3 μm, such as about 2 μm. To form small semiconductor structures, such as truncated pyramid-shaped semiconductor structures with a small horizontal linear dimension (e.g., about or less than 2 μm or 1 μm), each aperture of the array of apertures in the first overgrowth mask layer may have a polygonal or a circular shape with a diameter about or less than, for example, 500 nm, 200 nm, or 100 nm. To form larger semiconductor structures, such as truncated pyramid structures with a horizontal linear dimension about or greater than 500 nm or 1 μm, each aperture of the array of apertures in the first overgrowth mask layer may have a polygonal (e.g., hexagonal) shape. In some embodiments, each sidewall of a polygonal-shaped aperture may align with an m-plane of the substrate. As described above, the epitaxial growth may first occur through the apertures, and may then extend laterally. When the apertures have the size, shape, and sidewall orientation described above (e.g., having a small size and/or a polygonal (e.g., hexagonal) shape), the epitaxial growth through an aperture may naturally form a truncated pyramid-shaped semiconductor structure due to the preferential growth planes of the overgrowth process. For example, a cross-section of each semiconductor structure of the array of semiconductor structures may have a hexagonal shape. Each sidewall of the truncated pyramid may be in a semipolar plane, such as the $(11\bar{2}2)$ s2-plane or the $(10\bar{1}1)$ s5-plane.

Operations in block 2120 may include depositing a dielectric layer on the first doped semiconductor layer. In some embodiments, the dielectric layer may include a planar layer of, for example, SiN or $SiO_2$, as described above with respect to, for example, FIG. 13B or 15A. In some embodiments, the dielectric layer may include a plurality of DBR layers including interleaved layers of two dielectric materials having different refractive indices, and may be formed on surfaces of the array of semiconductor structures, as described above with respect to, for example, FIG. 19B.

Operations in block 2130 may include etching the dielectric layer as shown in, for example, FIG. 13C, 15B, or 19C, to form a plurality of cavities in the dielectric layer, where a pitch of the plurality of cavities may be non-uniform. In some embodiments, a width of a cavity of the plurality of cavities may be less than a quarter of a pitch of the plurality of cavities. In some embodiments, the cavities of the plurality of cavities may have different sizes and/or different shapes. In embodiments where the first doped semiconductor layer includes an array of semiconductor structures (e.g., truncated pyramid-shaped semiconductor structures), the cavities may be formed in the dielectric layer (e.g., DBR layers) on top of the array of semiconductor structures.

Operations in block 2140 may include growing active layers inside the plurality of cavities and on the first doped semiconductor layer. The active layers may include one or more quantum well layers and two or more quantum barrier layers. Because the active layers are epitaxially grown inside the cavities (rather than singulated by etching), the defect density at the sidewall of the active layers may be low.

Operations in block 2150 may include growing at least a portion of a second doped semiconductor layer inside the plurality of cavities and on the active layers. In some embodiments, the second doped semiconductor layer may only be grown inside the cavities. In some embodiments, a portion of the second doped semiconductor layer may be grown on top of the dielectric layer.

Optional operations in block 2160 may include forming a bonding layer on the second doped semiconductor layer and bonding the bonding layer to a backplane wafer. Optional operations in block 2170 may include forming an array of mesa structures, where each mesa structure may include the first doped semiconductor layer, the active layers, the second doped semiconductor layer, and the dielectric layer surrounding the active layers. Optional operations in block 2180 may include forming an array of micro-lenses in a semiconductor layer or a dielectric layer. Optional operations in blocks 2160-2180 may be performed in different orders and different combinations in different processes to form micro-LED devices with different structures.

In one example as shown in, for example, FIGS. 13E-13H, 14B, and 15D, operations in blocks 2160-2180 may include forming a bonding layer on the second doped semiconductor layer, bonding the bonding layer to a backplane wafer, removing the growth substrate layer to expose the first doped semiconductor layer, forming an array of micro-lenses in the first doped semiconductor layer or another semiconductor layer, etching through regions of at least the first doped semiconductor layer and the dielectric layer to form an array of mesa structures, and depositing filling materials that include a metal in regions between mesa structures of the array of mesa structures.

In another example as shown in, for example, FIG. 13I, operations in blocks 2160-2180 may include forming a bonding layer on the second doped semiconductor layer, bonding the bonding layer to a backplane wafer, removing the growth substrate layer to expose the first doped semiconductor layer, etching through regions of at least the first doped semiconductor layer and the dielectric layer to form an array of mesa structures, depositing filling materials that include a metal in regions between mesa structures of the array of mesa structures, depositing a lens material layer on the array of mesa structures, and forming an array of micro-lenses in the lens material layer.

In another example as shown in, for example, FIGS. 16B, 16C, and 17B, operations in blocks 2160-2180 may include etching regions of the dielectric layer and at least a portion of the first doped semiconductor layer to form an array of mesa structures, depositing filling materials that include a metal in regions between mesa structures of the array of mesa structures, forming a bonding layer on the array of mesa structures, bonding the bonding layer to a backplane wafer, removing the growth substrate layer to expose the first doped semiconductor layer, and forming an array of micro-lenses on the first doped semiconductor layer, where the array of micro-lenses may include a semiconductor material or a dielectric material.

In yet another example as shown in, for example, FIGS. 19E-19G, operations in blocks 2160-2180 may include forming a bonding layer on the second doped semiconductor layer, bonding the bonding layer to a backplane wafer, removing at least a portion of the growth substrate layer, depositing a transparent conductive layer on the growth substrate layer or the first doped semiconductor layer, depositing a lens material layer on the transparent conductive layer, and forming an array of micro-lenses in the lens material layer.

Embodiments disclosed herein may be used to implement components of an artificial reality system or may be implemented in conjunction with an artificial reality system.

Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 22:
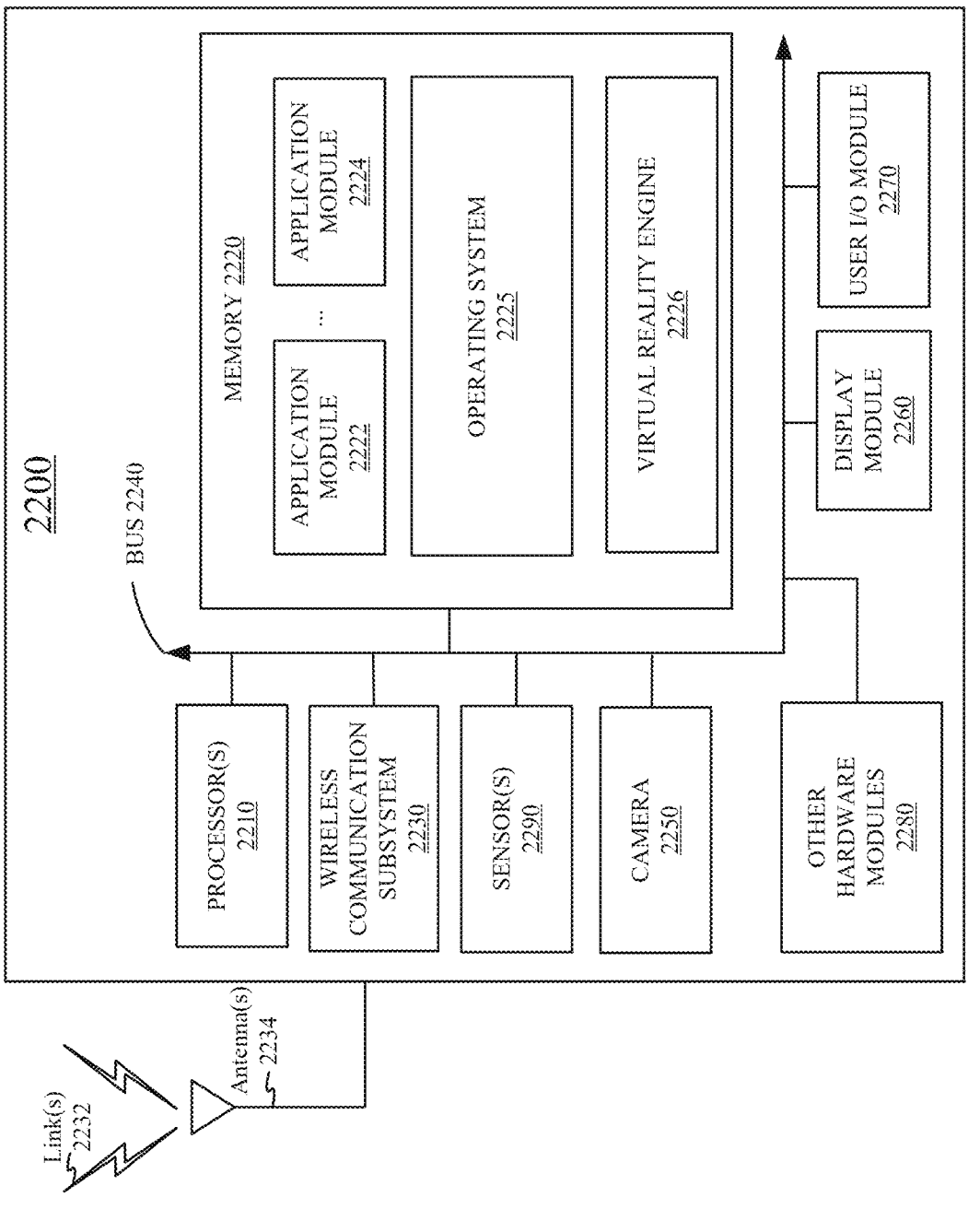
FIG. 22 is a simplified block diagram of an example of an electronic system of a near-eye display according to certain embodiments.

FIG. 22 is a simplified block diagram of an example of an electronic system 2200 of a near-eye display (e.g., HMD device) for implementing some of the examples disclosed herein. Electronic system 2200 may be used as the electronic system of an HMD device or other near-eye displays described above. In this example, electronic system 2200 may include one or more processor(s) 2210 and a memory 2220. Processor(s) 2210 may be configured to execute instructions for performing operations at a number of components, and can be, for example, a general-purpose processor or microprocessor suitable for implementation within a portable electronic device. Processor(s) 2210 may be communicatively coupled with a plurality of components within electronic system 2200. To realize this communicative coupling, processor(s) 2210 may communicate with the other illustrated components across a bus 2240. Bus 2240 may be any subsystem adapted to transfer data within electronic system 2200. Bus 2240 may include a plurality of computer buses and additional circuitry to transfer data.

Memory 2220 may be coupled to processor(s) 2210. In some embodiments, memory 2220 may offer both short-term and long-term storage and may be divided into several units. Memory 2220 may be volatile, such as static random access memory (SRAM) and/or dynamic random access memory (DRAM) and/or non-volatile, such as read-only memory (ROM), flash memory, and the like. Furthermore, memory 2220 may include removable storage devices, such as secure digital (SD) cards. Memory 2220 may provide storage of computer-readable instructions, data structures, program modules, and other data for electronic system 2200.

In some embodiments, memory 2220 may store a plurality of application modules 2222 through 2224, which may include any number of applications. Examples of applications may include gaming applications, conferencing applications, video playback applications, or other suitable applications. The applications may include a depth sensing function or eye tracking function. Application modules 2222-2224 may include particular instructions to be executed by processor(s) 2210. In some embodiments, certain applications or parts of application modules 2222-2224 may be executable by other hardware modules 2280. In certain embodiments, memory 2220 may additionally include secure memory, which may include additional security controls to prevent copying or other unauthorized access to secure information.

In some embodiments, memory 2220 may include an operating system 2225 loaded therein. Operating system 2225 may be operable to initiate the execution of the instructions provided by application modules 2222-2224 and/or manage other hardware modules 2280 as well as interfaces with a wireless communication subsystem 2230 which may include one or more wireless transceivers. Operating system 2225 may be adapted to perform other operations across the components of electronic system 2200 including threading, resource management, data storage control and other similar functionality.

Wireless communication subsystem 2230 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2200 may include one or more antennas 2234 for wireless communication as part of wireless communication subsystem 2230 or as a separate component coupled to any portion of the system. Depending on desired functionality, wireless communication subsystem 2230 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2230 may permit data to be exchanged with a network, other computer systems, and/or any other devices described herein. Wireless communication subsystem 2230 may include a means for transmitting or receiving data, such as identifiers of HMD devices, position data, a geographic map, a heat map, photos, or videos, using antenna(s) 2234 and wireless link(s) 2232.

Embodiments of electronic system 2200 may also include one or more sensors 2290. Sensor(s) 2290 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor.

Electronic system 2200 may include a display module 2260. Display module 2260 may be a near-eye display, and may graphically present information, such as images, videos, and various instructions, from electronic system 2200 to a user. Such information may be derived from one or more application modules 2222-2224, virtual reality engine 2226, one or more other hardware modules 2280, a combination thereof, or any other suitable means for resolving graphical content for the user (e.g., by operating system 2225). Display module 2260 may use LCD technology, LED technology (including, for example, OLED, ILED, μ-LED, AMOLED, TOLED, etc.), light emitting polymer display (LPD) technology, or some other display technology.

Electronic system 2200 may include a user input/output module 2270. User input/output module 2270 may allow a user to send action requests to electronic system 2200. An action request may be a request to perform a particular action. For example, an action request may be to start or end an application or to perform a particular action within the application. User input/output module 2270 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2200. In some embodiments, user input/output module 2270 may provide haptic feedback to the user in accordance with instructions received from electronic system 2200. For example, the haptic feedback may be provided when an action request is received or has been performed.

Electronic system 2200 may include a camera 2250 that may be used to take photos or videos of a user, for example, for tracking the user's eye position. Camera 2250 may also be used to take photos or videos of the environment, for example, for VR, AR, or MR applications. Camera 2250 may include, for example, a complementary metal-oxide-semiconductor (CMOS) image sensor with a few millions or tens of millions of pixels. In some implementations, camera 2250 may include two or more cameras that may be used to capture 3-D images.

In some embodiments, electronic system 2200 may include a plurality of other hardware modules 2280. Each of other hardware modules 2280 may be a physical module within electronic system 2200. While each of other hardware modules 2280 may be permanently configured as a structure, some of other hardware modules 2280 may be temporarily configured to perform specific functions or temporarily activated. Examples of other hardware modules 2280 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2280 may be implemented in software.

In some embodiments, memory 2220 of electronic system 2200 may also store a virtual reality engine 2226. Virtual reality engine 2226 may execute applications within electronic system 2200 and receive position information, acceleration information, velocity information, predicted future positions, or any combination thereof of the HMD device from the various sensors. In some embodiments, the information received by virtual reality engine 2226 may be used for producing a signal (e.g., display instructions) to display module 2260. For example, if the received information indicates that the user has looked to the left, virtual reality engine 2226 may generate content for the HMD device that mirrors the user's movement in a virtual environment. Additionally, virtual reality engine 2226 may perform an action within an application in response to an action request received from user input/output module 2270 and provide feedback to the user. The provided feedback may be visual, audible, or haptic feedback. In some implementations, processor(s) 2210 may include one or more GPUs that may execute virtual reality engine 2226.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, etc.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A light source comprising:
a backplane including drive circuits formed thereon;
an array of micro-light emitting diodes (micro-LEDs) bonded to the backplane, each micro-LED of the array of micro-LEDs including a mesa structure that includes:
a p-doped semiconductor layer;

an n-doped semiconductor layer;
an active region between the p-doped semiconductor layer and the n-doped semiconductor layer, wherein a shape of the active region of a first micro-LED of the array of micro-LEDs is different from a shape of the active region of a second micro-LED of the array of micro-LEDs; and
a dielectric layer underneath the p-doped semiconductor layer or the n-doped semiconductor layer and surrounding the active region, wherein the active region is epitaxially grown in the dielectric layer; and
an array of micro-lenses on the array of micro-LEDs, each micro-lens of the array of micro-lenses configured to collimate light emitted by a respective micro-LED of the array of micro-LEDs.

2. The light source of claim 1, wherein a center of the active region of a micro-LED of the array of micro-LEDs is horizontally offset from a center of the mesa structure of the micro-LED and a center of a corresponding micro-lens of the array of micro-lenses.

3. The light source of claim 1, wherein a width of the active region is less than 75% of a width of the p-doped semiconductor layer or the n-doped semiconductor layer.

4. The light source of claim 1, wherein a width of the active region of the first micro-LED of the array of micro-LEDs is different from a width of the active region of the second micro-LED of the array of micro-LEDs.

5. The light source of claim 1, wherein a horizontal offset between a center of the active region and a center of the mesa structure of the first micro-LED of the array of micro-LEDs is different from a horizontal offset between a center of the active region and a center of the mesa structure of the second micro-LED of the array of micro-LEDs.

6. The light source of claim 1, wherein the dielectric layer includes a plurality of distributed Bragg reflector layers formed on surfaces of the p-doped semiconductor layer or the n-doped semiconductor layer.

7. The light source of claim 1, wherein each micro-LED of the array of micro-LEDs further comprises a plurality of distributed Bragg reflector layers surrounding the dielectric layer and the p-doped or n-dope semiconductor layer, and wherein the plurality of distributed Bragg reflector layers includes semiconductor layers.

8. The light source of claim 1, wherein the p-doped semiconductor layer or the n-doped semiconductor layer is surrounded by the dielectric layer and is grown in the dielectric layer.

9. The light source of claim 1, wherein the array of micro-lenses includes stepped micro-lenses.

10. The light source of claim 1, wherein the array of micro-lenses includes a semiconductor material or a dielectric material.

11. The light source of claim 1, wherein a width of the active region is less than 25% of a pitch of the array of micro-LEDs.

12. The light source of claim 1, further comprising a transparent conductive layer between the array of micro-LEDs and the array of micro-lenses.

* * * * *